United States Patent
Gong et al.

(10) Patent No.: US 9,834,714 B2
(45) Date of Patent: Dec. 5, 2017

(54) PHOTORESPONSIVE, FORM-STABLE PHASE CHANGE COMPOSITES AND PHOTODETECTORS MADE THEREFROM

(71) Applicant: Wisconsin Alumni Research Foundation, Madison, WI (US)

(72) Inventors: Shaoqin Gong, Middleton, WI (US); Zhenqiang Ma, Middleton, WI (US); Yunming Wang, Madison, WI (US); Hongyi Mi, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 68 days.

(21) Appl. No.: 15/093,857

(22) Filed: Apr. 8, 2016

(65) Prior Publication Data

US 2016/0319175 A1    Nov. 3, 2016

Related U.S. Application Data

(60) Provisional application No. 62/153,563, filed on Apr. 28, 2015.

(51) Int. Cl.
| | |
|---|---|
| *H01J 40/14* | (2006.01) |
| *C09K 5/14* | (2006.01) |
| *H01L 51/44* | (2006.01) |
| *H01L 51/42* | (2006.01) |

(52) U.S. Cl.
CPC ............ *C09K 5/14* (2013.01); *H01L 51/42* (2013.01); *H01L 51/44* (2013.01)

(58) Field of Classification Search
CPC ............... C08K 3/04; C08K 5/00; C09K 5/14
USPC ........................................ 250/214.1; 428/332
See application file for complete search history.

(56) References Cited

U.S. PATENT DOCUMENTS

| | | | |
|---|---|---|---|
| 2003/0152764 A1* | 8/2003 | Bunyan | C09K 5/063 428/328 |
| 2013/0137054 A1 | 5/2013 | Jiang et al. | |
| 2014/0043754 A1 | 2/2014 | Hartmann et al. | |

(Continued)

FOREIGN PATENT DOCUMENTS

| | | |
|---|---|---|
| WO | WO2014071528 | 5/2014 |

OTHER PUBLICATIONS

Stefanescu et al., Insight into the Broad Field of Polymer Nanocomposites: From Carbon Nanotubes to Clay Nanoplatelets, via Metal Nanoparticles, Materials 2009, 2, Nov. 30, 2009, pp. 2095-2153.

(Continued)

*Primary Examiner* — Kevin Pyo
(74) *Attorney, Agent, or Firm* — Bell & Manning, LLC

(57) ABSTRACT

Composite materials comprising electrically conductive particles in a form-stable phase change materials (PCMs) are provided. Also provided as radiation sensors incorporating the composites and methods for detecting radiation using the composites. The PCMs comprise crosslinked polyether polyol that undergoes a reversible solid-solid phase change upon heating. Prior to the phase change, the crosslinked polyether polyol comprises microscopic crystalline domains. When the PCM is heated beyond its phase transition temperature these microscopic crystalline domains melt. However, the form-stable PCMs retain their solid form at the macroscopic level.

21 Claims, 25 Drawing Sheets

TTI 2,2'-dimethyldiphenylmethane-3,3',5,5'-tetraisocyanate toluene-2,4,6-Triyl Triisocyanate 3,4-(4',4''- isocynate-diphenlymethane)-phenylisocyanate

(56) References Cited

U.S. PATENT DOCUMENTS

2014/0105242 A1 4/2014 Fernandes et al.
2017/0205221 A1* 7/2017 Gong ................ G01B 7/18

OTHER PUBLICATIONS

Wang et al., Graphene/Phase Change Material Nanocomposites: Light-Driven, Reversible Electrical Resistivity Regulation via Form-Stable Phase Transitions, ACS Appl. Mater. Interfaces 2015, 7, Jan. 14, 2015, pp. 2641-2647.

Lebovka et al., Phase behaviour, microstructure, and percolation of poly(ethylene glycol) filled by multiwalled carbon nanotubes and organophilic montmorillonite, Journal of Composite Materials 45(24), May 10, 2011, pp. 2555-2566.

Meng et al., A poly(ethylene glycol)-based smart phase change material, Solar Energy Materials & Solar Cells 92 (2008), Jun. 30, 2008, pp. 1260-1268.

Wang et al., Flexible Infrared Responsive Multi-Walled Carbon Nanotube/Form-Stable Phase Change Material Nanocomposites, ACS Appl. Mater. Interfaces 2015, 7, Sep. 15, 2015, pp. 21602-21609.

Zhu et al., Focus-Tunable Microlens Arrays Fabricated on Spherical Surfaces, Journal of Microelectromechanical Systems, vol. 20, No. 2, Apr. 2011, pp. 389-395.

Zhu et al., Tunable-focus microlens arrays on curved surfaces, Applied Physics Letters, vol. 96, No. 081111, Feb. 25, 2010, pp. 1-3.

Mohamed et al., Hot electron and phonon dynamics of gold nanoparticles embedded in a gel matrix, Chemical Physics Letters, vol. 343, Jul. 27, 2001, pp. 55-63.

Alzari et al., Graphene-containing thermoresponsive nanocomposite hydrogels of poly(N-isopropylacrylamide) prepared by frontal polymerization, Journal of Materials Chemistry, vol. 21, May 10, 2011, pp. 8727-8733.

Sun et al., A one-step strategy for thermal- and pH-responsive graphene oxide interpenetrating polymer hydrogel networks, Journal of Materials Chemistry, vol. 21, Feb. 22, 2011, pp. 4095-4097.

Alzari et al., Stimuli-Responsive Polymer Hydrogels Containing Partially Exfoliated Graphite, Journal of Polymer Science: Part A: Polymer Chemistry, vol. 48, Oct. 1, 2010, pp. 5375-5381.

Scognamillo et al., Thermoresponsive Super Water Absorbent Hydrogels Prepared by Frontal Polymerization of N-Isopropyl Acrylamide and 3-Sulfopropyl Acrylate Potassium Salt, Journal of Polymer Science Part A: Polymer Chemistry, vol. 49, Jan. 10, 2011, pp. 1228-1234.

Lo et al., An infrared-light responsive graphene-oxide incorporated poly(N-isopropylacrylamide) hydrogel nanocomposite, Soft Matter, vol. 7, May 10, 2011, pp. 5604-5609.

Lo et al., Microfluidic Actuators Based on Infrared-Light Responsive PNIPAAM Hydrogel Nanocomposite Incorporating Graphene-Oxide, 2011 16th International Solid-State Sensors, Actuators and Microsystems Conference (Transducers), Beijing, China, Jun. 5-9, 2011, pp. 2430-2433.

Lo et al, "Microfluidic Actuators Based on Infrared-Light Responsive PNIPAAM Hydrogel Nanocomposite Incorporating Graphene-Oxide," Poster Presented at Transducers '11, The 16th International Conference on Solid-State Sensors, Actuators and Microsystems, Jun. 5-9, 2011.

Bai et al., A pH-sensitive grapheme oxide composite hydrogel, Chem. Commun., 2010, 46, pp. 2376-2378.

* cited by examiner

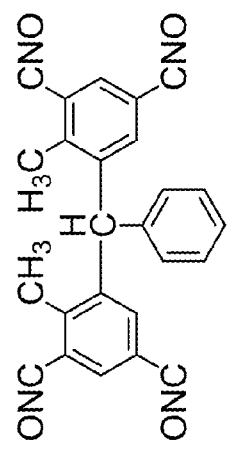
2,2'-dimethyldiphenylmethane-3,3',5,5'-tetraisocyanate
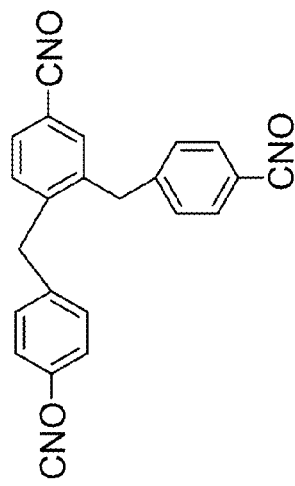
3,4-(4',4''-isocynate-diphenlymethane)-phenylisocyanate
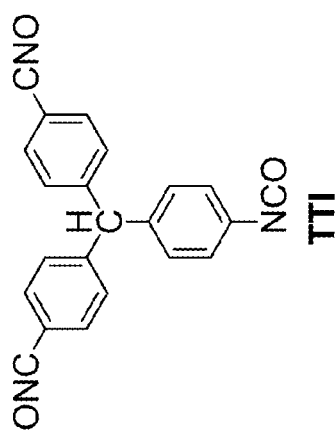
TTI
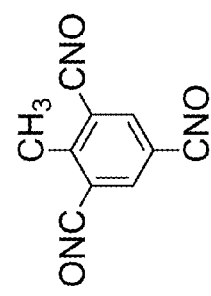
toluene-2,4,6-Triyl Triisocyanate
FIG. 1

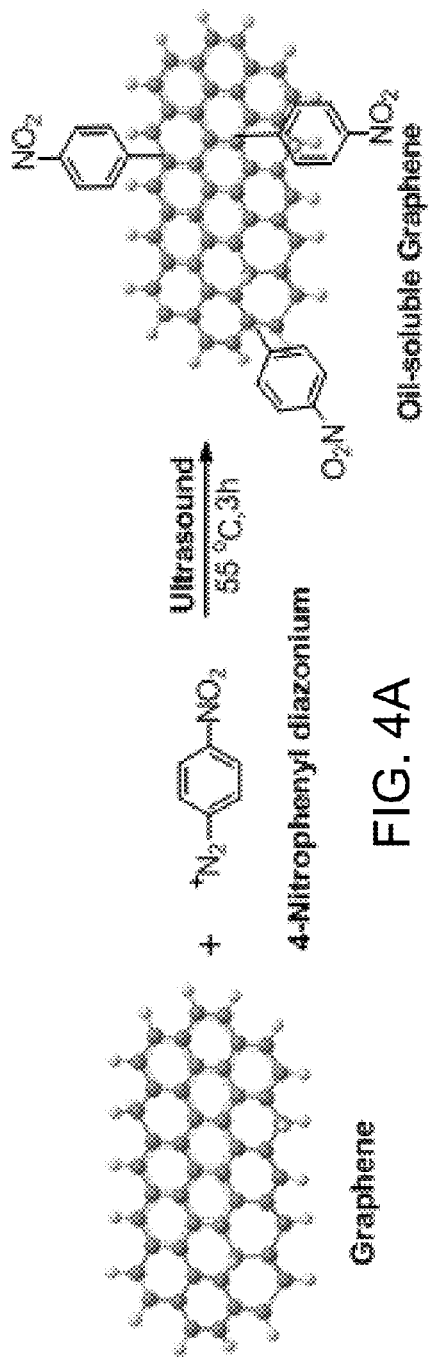
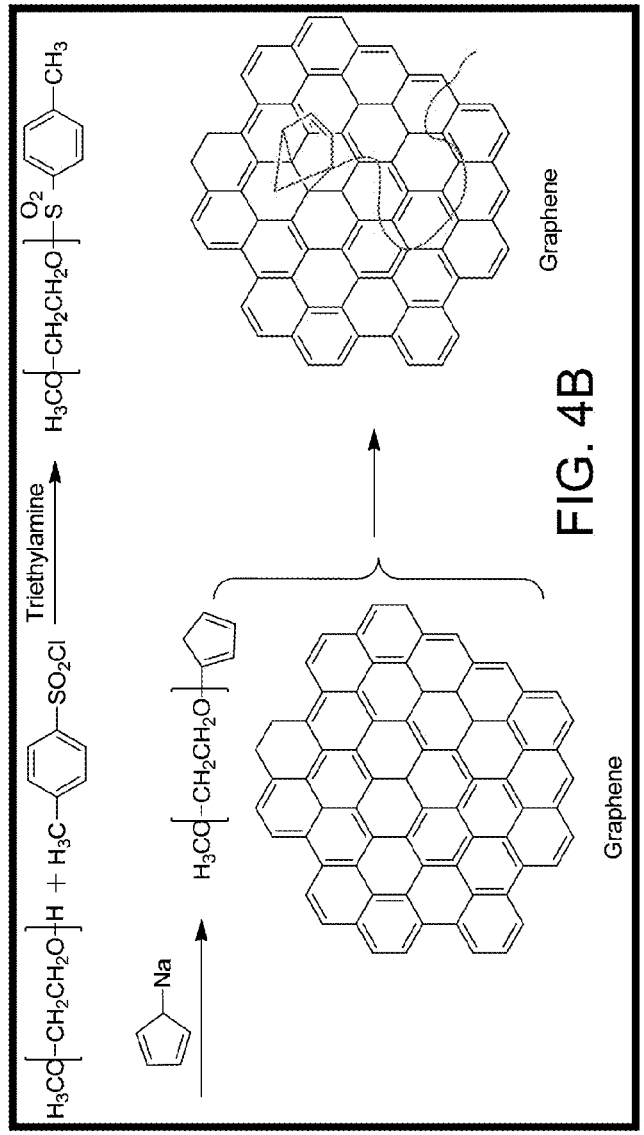
FIG. 4A
FIG. 4B

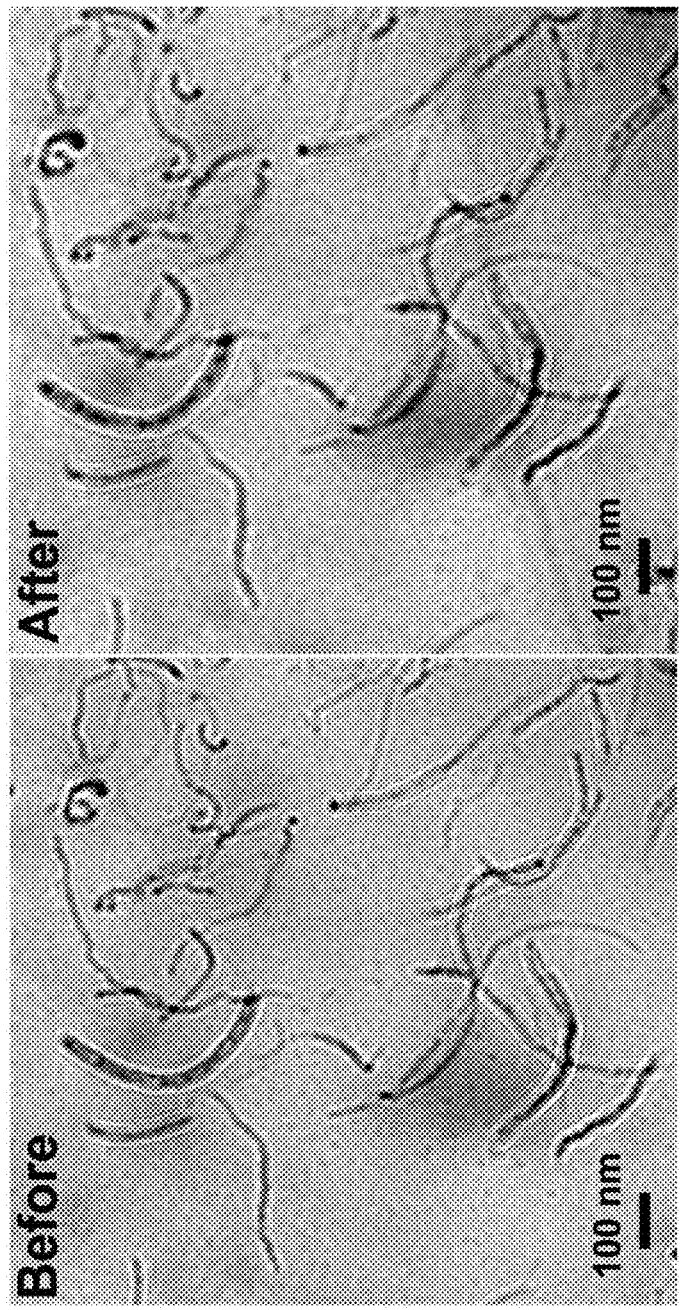

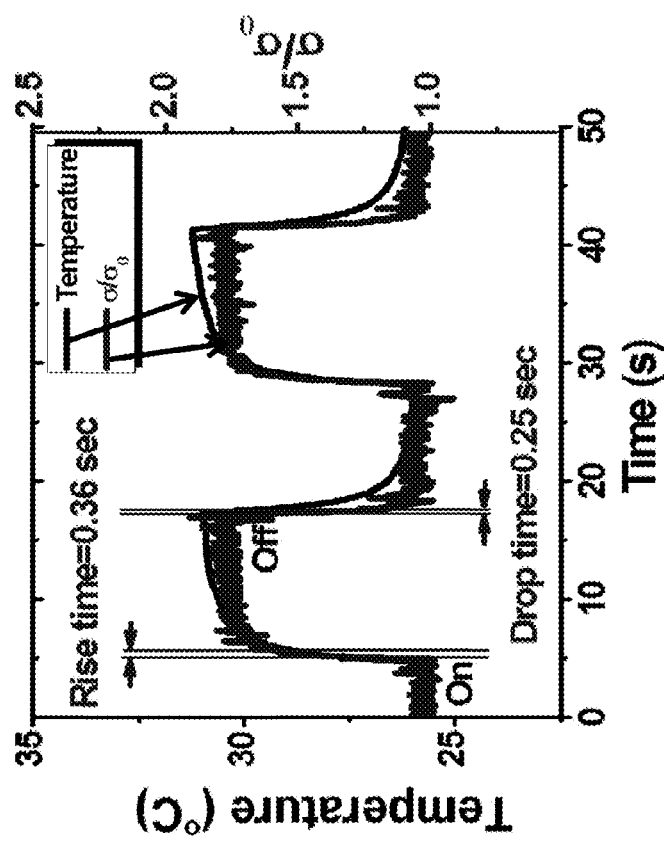
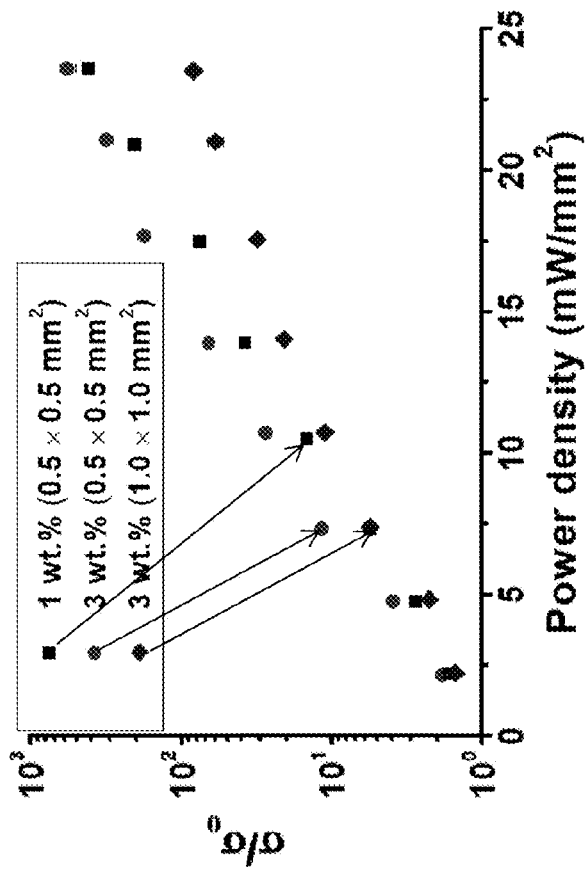
FIG. 26A
FIG. 26B

US 9,834,714 B2

PHOTORESPONSIVE, FORM-STABLE PHASE CHANGE COMPOSITES AND PHOTODETECTORS MADE THEREFROM

CROSS-REFERENCE TO RELATED APPLICATIONS

The present application claims priority to U.S. provisional patent application No. 62/153,563 that was filed on Apr. 28, 2015, the entire contents of which are hereby incorporated by reference.

REFERENCE TO GOVERNMENT RIGHTS

This invention was made with government support under FA9550-09-1-0482 awarded by the USAF/AFOSR. The government has certain rights in the invention.

BACKGROUND

Materials with tunable electrical conductivities can be used for many applications such as switching, storage, and sensing devices. Compared to inorganic materials, organic materials offer a number of advantages including easier processing and integration for large area electronics, lower cost, and better physical flexibility. Polymer nanocomposites, formed by mixing polymers with various types of nanoparticles, have been extensively investigated for many applications. The electrical conductivities of polymer nanocomposites containing conductive nanoparticles typically decrease with temperature and often exhibit a sharp drop near the polymer melting points. Beyond the polymer melting points, the electrical conductivities of the nanocomposites typically increase with temperature. (See, Tjong, S. C., Electrical Properties of Polymer Nanocomposites. In *Polymer Composites with Carbonaceous Nanofillers*, Wiley-VCH Verlag GmbH & Co. KGaA: 2012; pp 193-245.) While many studies have clearly demonstrated that electrical conductivities of certain polymer nanocomposites can be regulated via temperature, there are a number of limitations to these nanocomposites, including the following: (1) drastic conductivity changes occur near the melting temperatures of the polymers thereby limiting their application due to potential leakage problems; (2) electrical conductivity is typically lower at elevated temperatures; (3) reversible change of electrical conductivity is difficult to harness reproducibly; and (4) for certain applications, it may be impossible or less desirable to achieve direct temperature control using thermal devices, such as an oven or hot plate, making it necessary to employ remotely-controlled photosensitive materials.

Infrared (IR) sensing provides attractive applications in the field of optoelectronics, such as thermography, night vision, medical imaging, and surveillance. There have been previous studies on IR photoresponsive carbon nanotubes (CNTs) and CNT/polymer nanocomposites, in which the IR-induced response in electrical conductivity was mainly attributed to the photoexcitation of CNTs producing extra charge carriers and/or the thermal effect causing a change of CNT conductivity. However, these materials often exhibit relatively low IR sensitivities and inadequate physical flexibility, and may require complex fabrication processes that tend to hinder their potential applications.

SUMMARY

Composite materials comprising electrically conductive particles in a form-stable phase change material (PCM) are provided. Also provided are radiation sensors incorporating the composites and methods for detecting radiation using the composites.

One embodiment of a composite comprises: (a) a form-stable phase change material comprising crystalline domains of crosslinked polyether polyol surrounded by an amorphous matrix of crosslinked polyether polyol; (b) electrically conductive particles dispersed in the amorphous matrix of crosslinked polyether polyol; and (c) radiation-absorbing particles dispersed in the amorphous matrix of crosslinked polyether polyol. (The electrically conductive particles and the radiation-absorbing particles can be the same particles.) The form-stable phase change material is characterized in that it undergoes a reversible solid form-stable phase transition upon heating. The form-stable phase change material may comprise polyethylene glycol crosslinked with triphenymethane triisocyanate.

One embodiment of a photodetector comprises: a composite and a probe configured to measure a phase change-induced change in the electrical resistivity of the composite. In the photodetector, the composite comprises: (a) a form-stable phase change material comprising crystalline domains of crosslinked polyether polyol surrounded by an amorphous matrix of crosslinked polyether polyol, the form-stable phase change material characterized in that it undergoes a reversible form-stable phase change upon heating; (b) electrically conductive particles dispersed in the amorphous matrix of crosslinked polyether polyol; and (c) radiation-absorbing particles dispersed in the amorphous matrix of crosslinked polyether polyol and characterized in that they are capable of absorbing radiation and converting it into thermal energy. (The electrically conductive particles and the radiation-absorbing particles can be the same particles.)

One embodiment of a method of detecting radiation comprises the steps of: exposing a composite to radiation and measuring a phase change-induced change in the electrical resistivity of the composite. In the method, the composite comprises: (a) a form-stable phase change material comprising crystalline domains of crosslinked polyether polyol surrounded by an amorphous matrix of crosslinked polyether polyol; (b) electrically conductive particles dispersed in the amorphous matrix of crosslinked polyether polyol; and (c) radiation-absorbing particles dispersed in the amorphous matrix of crosslinked polyether polyol. (The electrically conductive particles and the radiation-absorbing particles can be the same particles.) The radiation absorbing particles absorb the radiation, which increases the temperature of the form-stable phase change material and induces it to undergo a reversible form-stable phase transition from a first solid phase to a second solid phase.

In some of the composites, photodetectors and methods the polyether polyols are polyethylene glycols or polytetrahydrofurans. In some of the composites, photodetectors and methods the particles are carbon-based particles, such as graphene or carbon nanotubes.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1. Multifunctional isocyanate crosslinking agents.

FIG. 4A. Reaction scheme showing the surface functionalization of graphene with nitrophenyl groups.

FIG. 4B. Reaction scheme showing the surface functionalization of graphene with polyethylene oxide.

FIG. 23A. TEM image of the 3 wt. % MWCNT/PCM nanocomposite taken at room temperature before IR irradiation (23.6 mW/mm$^2$ for 10 sec). FIG. 23B. TEM image of the 3 wt. % MWCNT/PCM nanocomposite taken at the room temperature after IR irradiation (23.6 mW/mm$^2$ for 10 sec).

FIG. 26A. The IR power density dependence of the on/off electrical conductivity ratios ($\sigma/\sigma_0$) for nanocomposite films with different MWCNT loading contents (i.e., 1 vs. 3 wt. %) or different sample sizes (i.e., 0.5×0.5 mm$^2$ vs. 1.0×1.0 mm$^2$). FIG. 26B. The photoresponses of the on/off electrical conductivity ratios ($\sigma/\sigma_0$) and temperature profiles of the 3 wt. % MWCNT/PCM nanocomposite at an IR power density of 2.2 mW/mm$^2$, size: 0.5×0.5 mm$^2$.

DETAILED DESCRIPTION

Composite materials comprising electrically conductive particles in a form-stable PCM are provided. Also provided are radiation sensors incorporating the composites and methods for detecting radiation using the composites.

The PCMs comprise crosslinked polyether polyols that undergo a reversible solid-solid phase change upon heating. Prior to the phase change, the crosslinked polyether polyols comprise microscopic crystalline domains dispersed in an elastic, non-crystalline crosslinked polyether polyol matrix. Electrically conductive particles are dispersed within the non-crystalline matrix, around the crystalline domains. When the PCMs are heated beyond their phase transition temperature these crystalline domains melt. However, even after this phase change, the form-stable PCMs retain their solid form at the macroscopic level. Consequently, the form-stable PCMs undergo a transition from a first solid phase that comprises crystalline domains to a second solid phase that comprises liquid domains. Yet, since the liquid domains are retained in a solid matrix, the PCMs experience no, or substantially no, changes in their physical dimensions at the macroscopic level as a result of the phase transition. The localized melting of the crystalline domains causes a localized volume expansion, which exerts a compressive stress on the matrix surrounding the expanded domains. This leads to a reduction in the thickness of the matrix between the conductive particles that are dispersed therein, thereby enhancing the electron tunneling efficiency between the particles and increasing the electrical conductivity of the composite. The result is a measurable drop in the resistivity and/or a measurable increase in the thermal conductivity of the composite.

Crosslinking the polyether polyols in the composites prevents the PCM from undergoing a macroscopic solid-to-liquid phase transition at the phase transition temperature. The polyether polyol polymers are characterized by the structure —[R—O]$_n$— along their backbone, where R represents an alkyl group. Polyethylene glycol (PEG) and polytetrahydrofuran (PTHF) are examples of polyether polyols that can be used in the composites. PEG polymers are characterized by the structure —[CH$_2$—CH$_2$—O]$_n$— along their backbone, while PTHF polymers are characterized by the structure —[CH$_2$—CH$_2$—CH$_2$—CH$_2$—O]$_n$— along their backbone, where n represents the number of repeat units in the structures. A variety of polyether polyol polymers and mixtures of polyether polyol polymers can be used. By way of illustration only, suitable PEG polymers include those having a molecular weight (Mn) in the range from about 0.6 to about 40 kDa. Suitable PTHF polymers include those having a molecular weight (Mn) in the range from about 0.5 to about 10 kDa.

Figure 2:
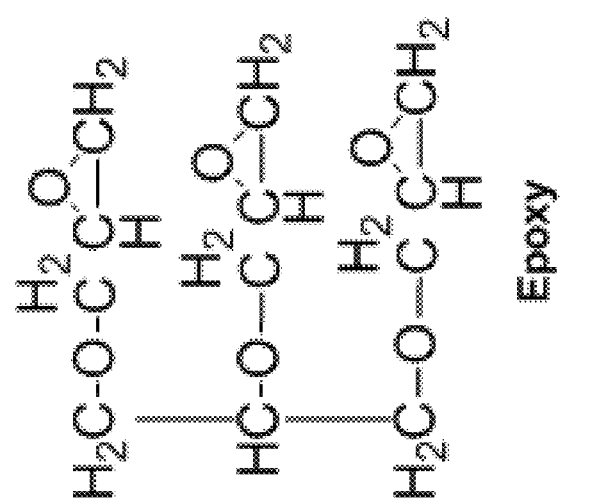
FIG. 2. A multifunctional epoxy crosslinking agent.

The crosslinking agents used to form the crosslinks between the polyether polyol molecules in the PCM have at least two crosslinking groups and desirably have at least three crosslinking groups, so that the crosslinked polyether polyol is a highly branched structure. In some embodiments, the crosslinking agents are multifunctional isocyanates. These include aryl, aliphatic, cycloaliphatic, arylaliphatic, aromatic and heterocyclic polyisocyanates. Specific examples of these include phenyl group-containing and toluene group-containing crosslinking agents, such as triphenymethane triisocyanate (TTI), toluene-2,4,6-triyl triisocyanate, 3,4-(4',4''-isocyanate-diphenylmethane)-phenylisocyanate, 2,2'-dimethyldiphenylmethane-3,3',5,5'-tetraisocyanate, 2,6-toluene diisocyanate, 2,4-toluene diisocyanate, 2,4'-diphenymethane diisocyanate, and 4,4'-diphenylmethane diisocyanate. The structures of these crosslinking agents are shown in FIG. 1. However, other crosslinking agents may comprise crosslinking groups other than, or in addition to, isocyanate groups. For example, the crosslinking agents may be epoxy-functional molecules, an example of which is shown in FIG. 2.

Figure 3:
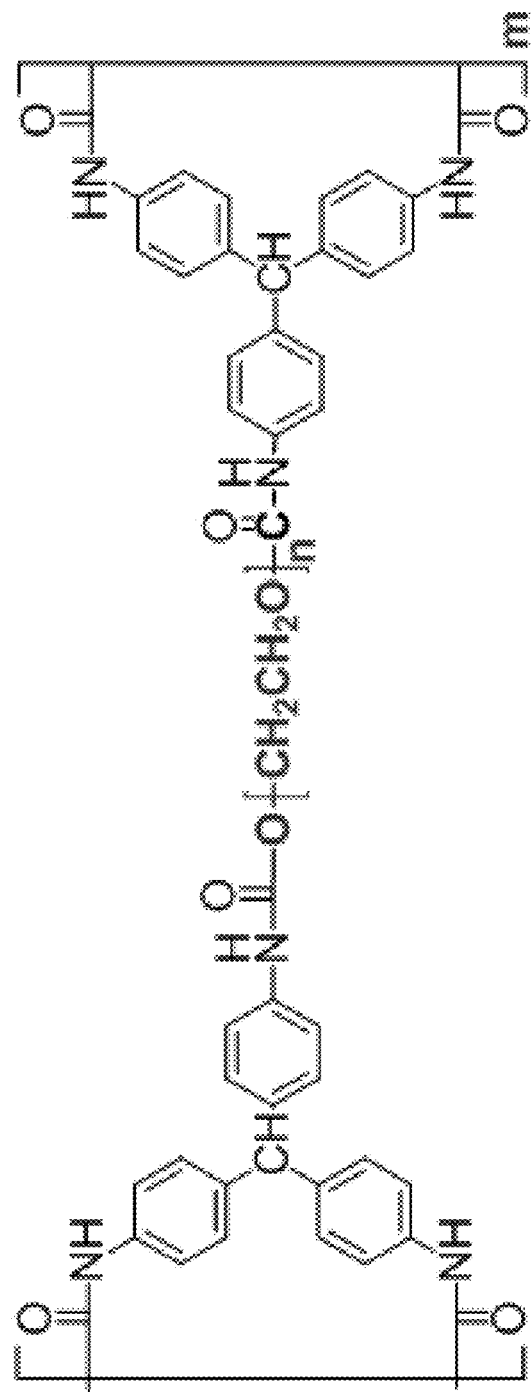
FIG. 3. Polyethylene glycol crosslinked with triphenylmethane triisocyanate.

When isocyanate groups are used to crosslink the polyether polyol, the resulting linkages will comprise urethane groups. If the crosslinking agents are aryl isocyanates, the urethane groups may be part of an aryl group in the linkages. When epoxides are used as crosslinking agents, the polyether polyol molecules will be linked via ester linkages. One example of a PCM comprising PEG crosslinked by an isocyanate crosslinking agent (TTI) is shown in FIG. 3.

The degree of crosslinking in the PCMs should be sufficient to prevent the PCMs from undergoing a macroscopic solid-to-liquid phase transition at the phase transition temperature, but not so high as to render the PCM insoluble in the solutions used to form the composite materials. Thus, the optimal degree of crosslinking will depend on the polyether polyols, crosslinking agents and solvents being used. By way of illustration only, in some embodiments of the crosslinked PEGs, the mole ratio of the reactive groups in the crosslinking agent to the hydroxyl groups in the PEG is in the range from about 0.8:1 to about 1.2:1.

The electrically conductive particles dispersed within the PCM matrix of the composites serve to provide a path or network for conducting electricity and/or heat through the composite as a result of the temperature-induced phase change. In some embodiments of the composites, the electrically conductive particles also serve as microheaters that absorb incident radiation and convert it into thermal energy, which increases the temperature of the PCM and induces the macroscopic solid-to-solid phase change. In other embodiments of the composites, a second set of particles—that differ from the electrically conductive particles—is provided to absorb the incident radiation and convert it into thermal energy, thereby heating the PCM. In either embodiment, the radiation absorbing particles desirably have a high absorptivity and low heat capacity. The wavelengths of radiation that are absorbed by the particles in the composite will depend on the nature of the particles being used. In some embodiments, the particles absorb radiation in the IR region of the electromagnetic spectrum (i.e., from about 700 nm to about 1 mm), including the near IR region (i.e., from about 750 nm to about 1.4 µm).

The electrically conductive particles can be made from a variety of materials and can take on a variety of shapes. For example, in some embodiments the electrically conductive particles are carbon-based materials, such as CNTs (single-walled and/or multiwalled), graphene particles, fullerenes, and/or carbon black particles. CNTs are well suited to use in the composites because they are very sensitive to radiation due to their low densities, high surface areas, and negligible heat capacities. In particular, CNTs possess unique IR responsive properties, including strong photoabsorption, photothermal conversion, and photoacoustic generation due to their π-conjugated structures. Graphene is also a good choice. Graphene, a crystalline form of carbon that is one-atom thick, exhibits many desirable properties including a large surface area, excellent chemical stability, and superior electrical and thermal conductivities. In addition, like CNTs, graphene can effectively absorb photons and subsequently convert optical energy into thermal energy. Metals and electrically conductive metal-containing compounds can also be used. Examples of these include gold and palladium nanoparticles and nanowires. The conductive particles are located in the non-crystalline matrix region of the composite, with few, if any, located in the crystalline domains.

Figure 5:
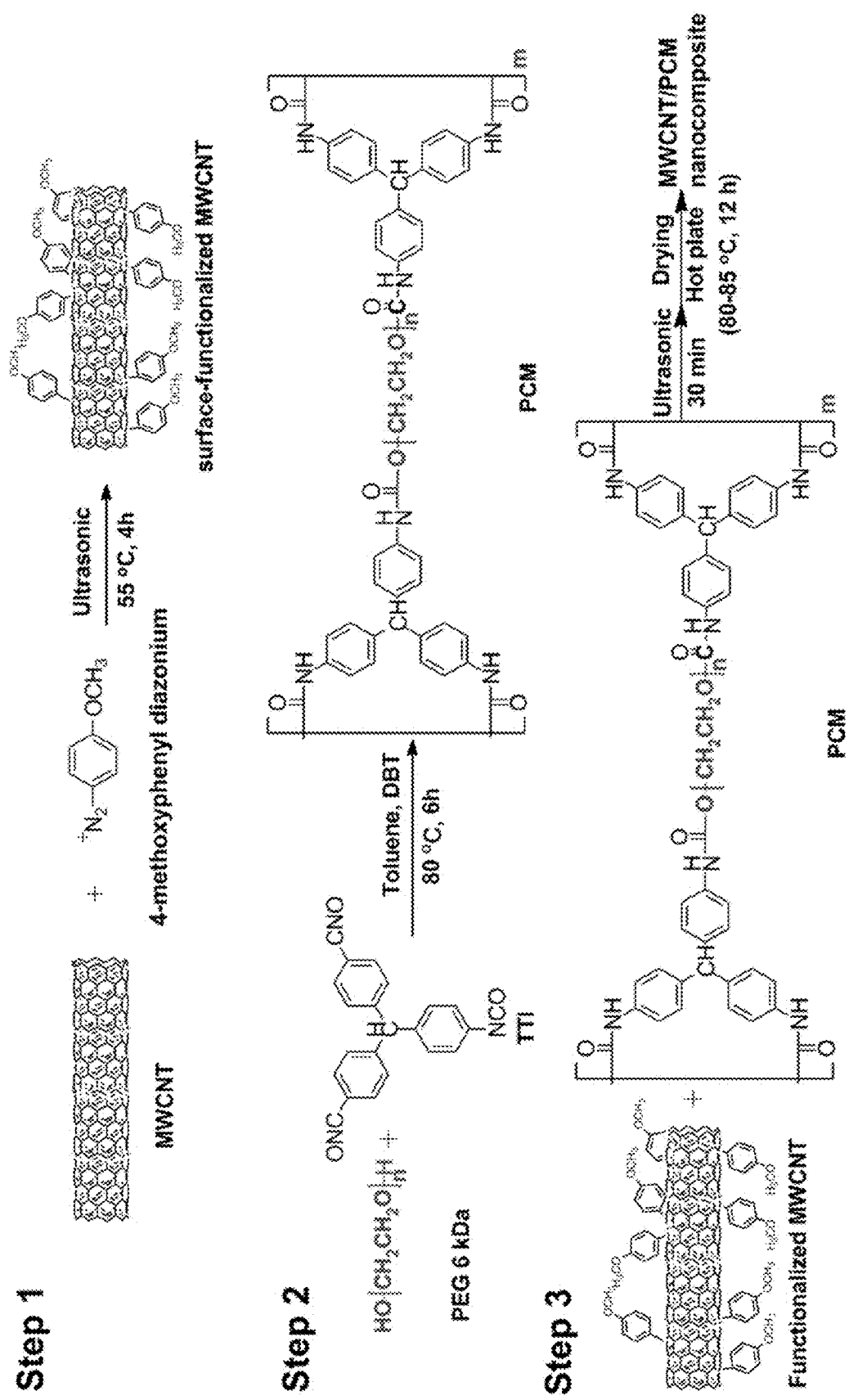
FIG. 5. Scheme 1. The synthesis and fabrication process for a surface-functionalized MWCNT (Step 1), PCM (Step 2), and a multiwalled CNT (MWCNT)/PCM composite (Step 3).

In some embodiments of the composites, the electrically conductive particles are surface-functionalized in order to provide a more uniform dispersion of the particles in the polyether polyol matrix. Functional groups that may enhance the dispersibility of the particles in PEG include p-methoxyphenyl groups, polyethylene oxide, and nitrophenyl groups, such as 2,4-dinitrophenyl groups and 2-cyano-4-nitrophenyl groups. For example, if graphene particles are used, they may be surface-functionalized with nitrophenyl groups, as shown in FIG. 4A and described in more detail in Example 1, or with polyethylene oxide (PEO). The latter functionalization can be carried out using a Diels-Alder reaction as shown in FIG. 4B. Similarly, if multiwalled carbon nanotubes are used, they may be surface-functionalized with p-methoxyphenyl diazonium salts, as shown in FIG. 5 (Step 1) and described in more detail in Example 2.

Figure 6:
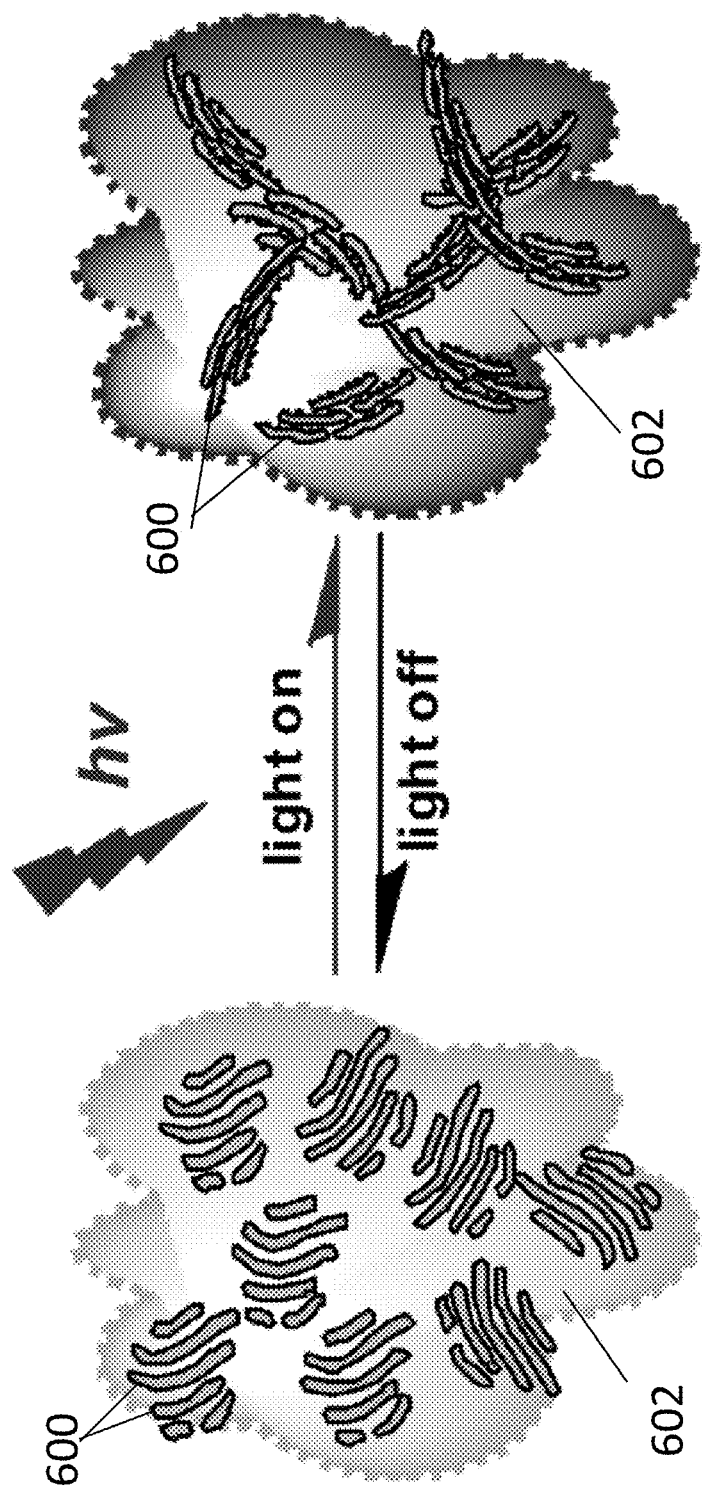
FIG. 6. Conceptual illustration of the structural change in a PCM that increases the tunneling efficiency of dispersed graphene particles in response to the cyclic melting and recrystallization phase transition processes regulated by on/off light illumination.
Figure 7:
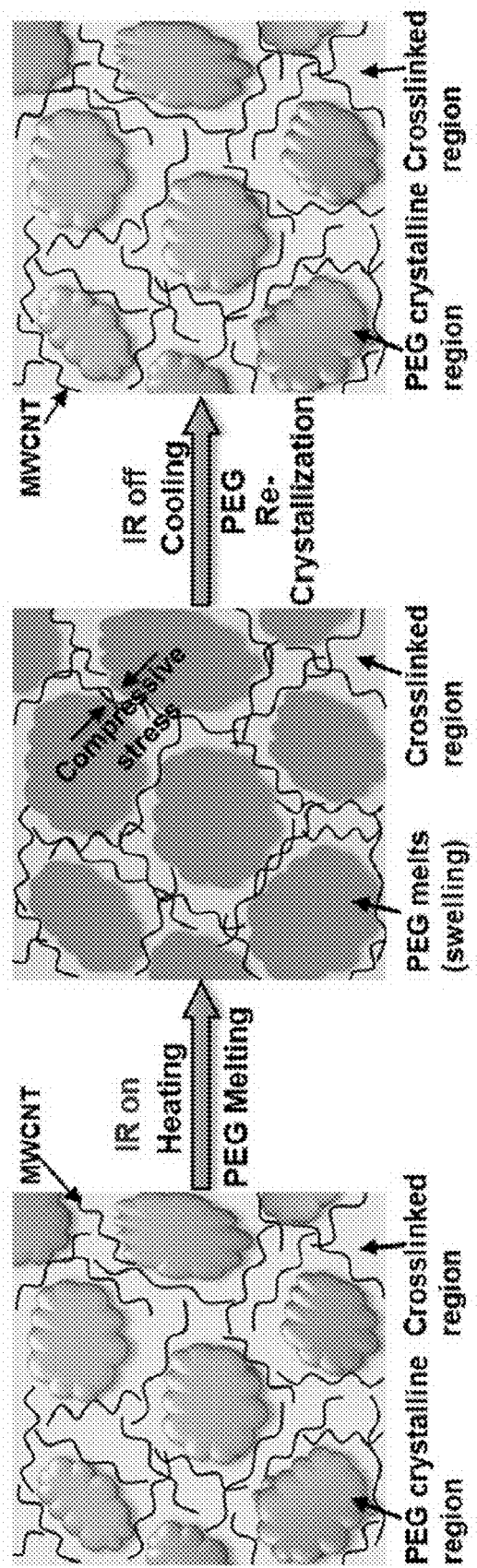
FIG. 7. Conceptual illustration of the cyclic, dramatic, and reversible electrical conductivity changes observed in the MWCNT/PCM nanocomposite films regulated by IR.

FIGS. 6 and 7 are schematic diagrams showing the structural changes in the composites as the crystalline polyether polyol domains in the PCM undergo a transition from a crystalline solid phase to an amorphous liquid phase. In the composite of FIG. 6, the electrically conductive particles are graphene particles 600 dispersed in a crosslinked polyether polyol (e.g., PEG) matrix 602. In the embodiment shown here, graphene particles 600 do not form a continuous path through the polyether polyol in the initial solid phase (left panel). However, when the composite is irradiated with light (hu), the PCM undergoes conversions into a second solid phase (right panel) as the result of the melting of crystalline polyether polyol microdomains. As a result, the connectivity and/or tunneling efficiency between graphene particles 600 in the PCM increases and one or more new or more efficient paths are formed in the PCM, as shown in the right panel. The formation or increased efficiency of these paths, through which electrons can transport, results in a decrease in the electrical resistivity of the composite.

In the composite of FIG. 7, the electrically conductive particles are carbon nanotubes 700 dispersed in a non-crystalline crosslinked polyether polyol (e.g., PEG) matrix 702 in which a plurality of crystalline polyether polyol microdomains are embedded (left panel). In the embodiment shown here, carbon nanotubes 700 do not form a continuous path through the polyether polyol in the initial solid phase (left panel). However, when the composite is irradiated with IR light, the PCM undergoes conversion into a second solid phase (middle panel) as the result of the localized melting of crystalline polyether polyol microdomains 706. The localized melting of the crystalline domains causes a localized volume expansion, which exerts a compressive stress on the matrix surrounding the expanded domains. The compression of the elastic matrix brings the conductive particles closer to one another, thereby enhancing the electron tunneling efficiency between the particles and increasing the electrical conductivity of the composite. As shown in FIGS. 6 and 7 (right panel), the phase change and, therefore, the change in the resistivity of the composite is reversible. That is, the melted polyether polyol domains revert to their initial crystalline phase when the incident radiation is discontinued.

The concentration of the electrically conductive particles in the composite to achieve the maximum light-induced electrical conductivity change varies based on the type of PCM matrix and the type of conductive particles, as well as their functionalization. Generally, the optimal concentration should be lower than, but close to, the electrical percolation threshold when the PCM is in its initial phase because that is where the composites are most sensitive to changes in structure and internal stress. The concentration of the electrically conductive particles should be sufficiently high that electrically conductive paths are created by the phase change, but is desirably sufficiently low that the electrical conductivity of the composite is still low prior to the phase change. Composites having a significant electrical conductivity even in their initial phase can be used. However, the phase change-induced change in resistivity for such composites may not be as large. By way of illustration only, in some embodiments of the composites the concentration of electrically conductive particles is in the range from about 0.5 to about 15 weight percent (wt. %). This includes embodiments in which the concentration of electrically conductive particles is in the range from about 0.5 to about 10 wt. % and further includes embodiments in which the concentration of electrically conductive particles is in the range from about 1 to about 5 wt. %.

As noted above, the change in the resistivity of the composites as the result of the phase transition will depend in part on the initial resistivity of the composites. However, the resistivity change can be quite dramatic if the initial electrical conductivity is low (and, therefore, the initial electrical resistivity is high). In some embodiments of the composites the resistivity decreases by a factor of at least 10 as a result of the phase transition. This includes embodiments in which the resistivity decreases by a factor of at least 100 as a result of the phase transition and further includes embodiments in which the resistivity decreases by a factor of at least 1000 as a result of the phase transition. In addition, the reversible changes in the resistivity of the composite have a sharp onset.

The large, sharp and reversible phase change-induced change in the resistivity of the composites makes them well suited for use as active materials in radiation detectors, the basic components of which comprise a layer of the composite and a probe configured to measure a resistivity change in the composite. The probe may be configured to measure the change in resistivity directly or indirectly by measuring a change in conductivity. Thus, for the purposes of this disclosure, a probe that is configured to measure a change in conductivity is also considered to be configured to measure a change in resistivity, since the two properties have a reciprocal relationship. The layer of composite will typically, but not necessarily, take the form of a thin film. A radiation detector may comprise a pair of electrically conductive contacts, such as metal (e.g., gold) contacts, arranged such that they are separated by a gap. This gap is bridged by the composite, such that the composite provides a path for conducting electricity between the contacts in a resistivity measurement circuit. (Again, since resistivity and conductivity are reciprocal properties, a conductivity measurement circuit is considered, for the purposes of this disclosure, to be a type of resistivity measurement circuit.) The probe can then be connected across these contacts. The probe may comprise a parameter analyzer. An example of a suitable analyzer is the HP4155 semiconductor parameter analyzer. The radiation detector may further include a substrate upon which the layer of the composite is supported. During operation, the composite of the radiation detector is exposed to incident radiation, at least a portion of which is absorbed by the electrically conductive particles and converted into thermal energy. As a result the temperature of the PCM is increased and it undergoes a reversible phase change from a first solid phase to a second solid phase. This phase change results in an increased connectivity and/or tunneling efficiency between the electrically conductive particles in the PCM, which is accompanied by a measurable decrease in its resistivity.

In addition to allowing for an increased flow of electricity through the composites, new continuous paths that are formed by the electrically conductive particles as a result of the phase change in the PCM may provide enhanced thermal conductivity through the composites. Therefore, the composites can also be incorporated into radiation detectors that register a phase change-induced change in the thermal conductivity of the composites. These radiation detectors comprise a layer of the composite and a probe configured to measure a thermal conductivity change in the composite. During operation, the composite of the radiation detector is exposed to incident radiation, at least a portion of which is absorbed by the electrically conductive particles and converted into thermal energy. As a result the temperature of the PCM is increased and it undergoes a reversible phase change from a first solid phase to a second solid phase. This phase change results in an increased connectivity between the electrically conductive particles in the PCM, which is accompanied by a measurable increase in its thermal conductivity.

The photodetectors may be arranged in a photodetector array comprising a plurality of the photodetectors connected to one or more electrical resistivity and/or thermal conductivity probes in a photodetector array circuit. The use of a photodetector array provides for a large total detector area, while allowing the individual photodetectors in the array to have small surface areas. This is advantageous because composites with smaller areas may provide a larger and/or faster photoresponse.

Example 1

This example describes a photoresponsive nanocomposite composed of graphene and a form-stable phase change material that exhibited a three orders of magnitude change in electrical resistivity upon light illumination, while retaining its overall original solid form at the macroscopic level.

In this example, the PCM was synthesized from PEG and TTI via a condensation polymerization reaction that did not generate any small molecule byproducts.

For this study, functionalized graphene was uniformly dispersed in the PCM and was used as a light-driven nanoheater for the graphene/PCM nanocomposites to induce the form-stable phase transition. Moreover, graphene was also used as an electrically conductive nanofiller for the electrically insulating PCM matrix. The resulting graphene/form-stable PCM nanocomposite can provide an attractive medium for light-driven, temperature-regulated electrical properties through form-stable phase transitions. Specifically, up to three orders of magnitude change in electrical resistivity was observed reversibly and reproducibly through the control of on/off switching of light irradiation. Furthermore, the change of magnitude in electrical resistivity can be adjusted by the concentration of the graphene in the nanocomposite. The graphene/PCM nanocomposites also showed desirable mechanical properties. Thus, these graphene/PCM nanocomposites are useful for various applications including flexible photoresponsive electronics.

Results and Discussion

The compositions of the PCM and graphene/PCM nanocomposites employed for this Example are shown in Table 1.

TABLE 1

Sample identification and their nanocompositions.

| Sample | Composition |
| --- | --- |
| PCM | PEG 20000:TTI = 3:2 [a] |
| 1 wt. % graphene/PCM | graphene:PCM = 1:100 [b] |
| 3 wt. % graphene/PCM | graphene:PCM = 3:100 |
| 5 wt. % graphene/PCM | graphene:PCM = 5:100 |
| 7 wt. % graphene/PCM | graphene:PCM = 7:100 |
| 10 wt. % graphene/PCM | graphene:PCM = 10:100 |

[a] Molar ratios of polyethylene glycol (PEG) and triphenylmethane triisocyanate (TTI);
[b] Weight ratios of surface-functionalized graphene to PCMs.

The PCM was synthesized by reacting TTI with polyethylene glycol (PEG 20 kDa). In order to improve the dispersion of graphene in the PCM, nitrophenyl groups were introduced onto the graphene surfaces. (Lomeda, J. R.; Doyle, C. D.; Kosynkin, D. V.; Hwang, W. F.; Tour, J. M., Diazonium Functionalization of Surfactant-Wrapped Chemically Converted Graphene Sheets. *J. Am. Chem. Soc.* 2008, 130, 16201-16206.) The graphene loading content varied from 1 to 10 wt. % in the PCM matrix.

Figure 11:
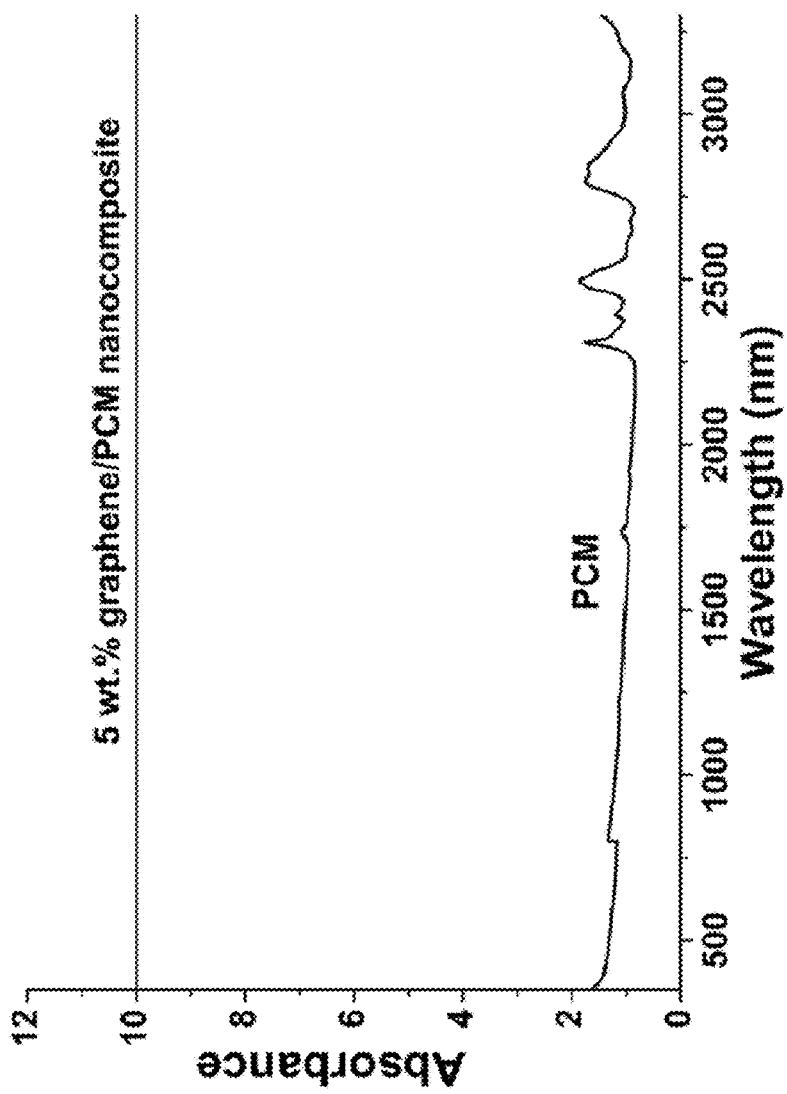
FIG. 11. UV-vis-NIR absorbance spectra of a PCM (thickness of 0.36 mm) and 5 wt. % graphene/PCM nanocomposites (thickness 0.12 mm), in accordance with Example 1.

As shown in FIG. 11, ultraviolet-visible-near infrared (UV-vis-NIR) absorbance spectra of the PCM and graphene/PCM nanocomposite films showed that, in contrast to the PCM film, the graphene/PCM nanocomposite film exhibited almost complete absorbance throughout the UV-vis-NIR range due to the presence of 5 wt. % graphene in the composites. More importantly, graphene effectively converted the absorbed optical energy into heat, thereby providing the thermal energy needed to drive the phase transition of the PCMs as demonstrated by the XRD analysis described below.

Figure 13:
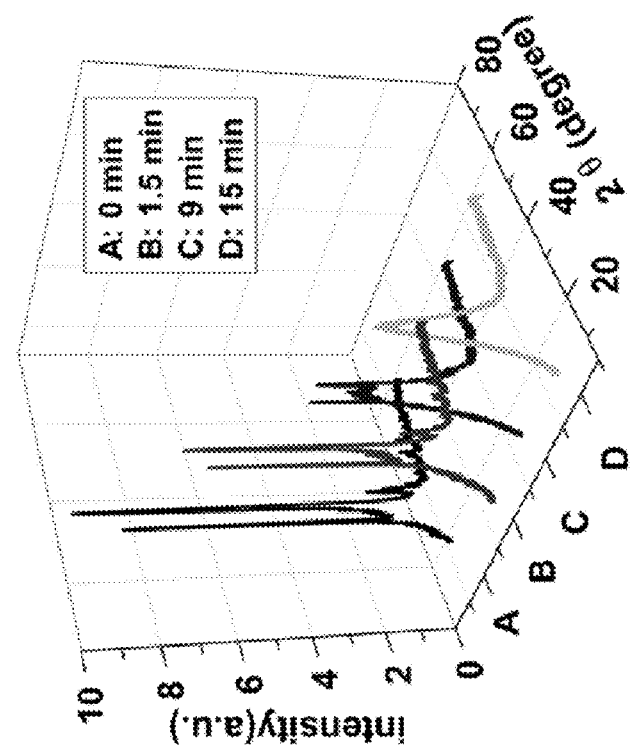
FIG. 13. A series of XRD spectra of the 5 wt. % graphene/PCM nanocomposite of Example 1 subjected to white light irradiation (12.5 mW/cm$^2$).
Figure 12:
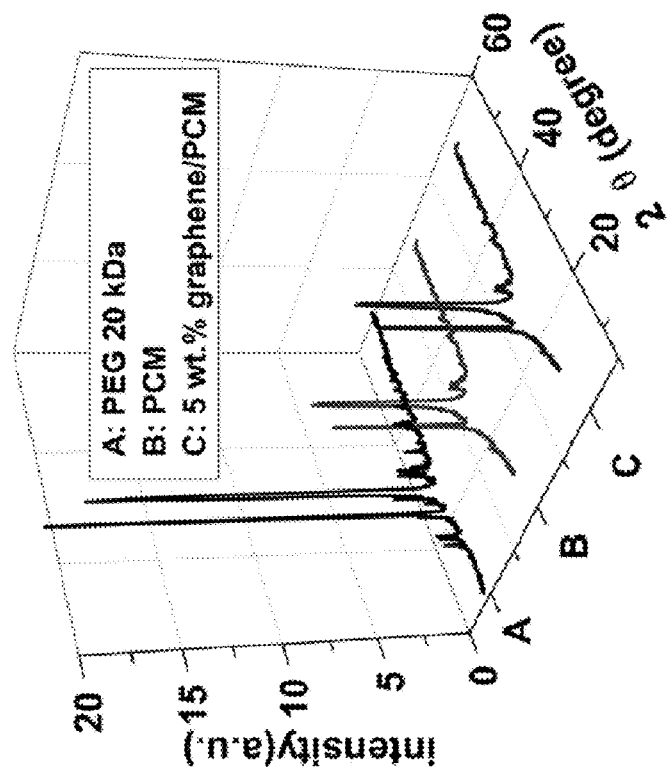
FIG. 12. The XRD spectra of the PEG (20 kDa), PCM, and graphene/PCM nanocomposite of Example 1.
Figure 14:
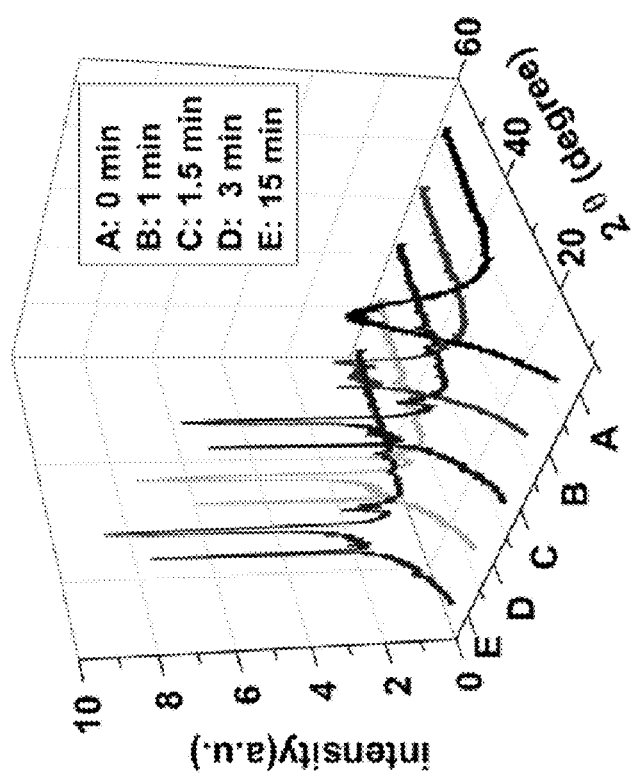
FIG. 14. A series of XRD spectra of the 5 wt. % graphene/PCM nanocomposite of Example 1 after removing the light irradiation.

The XRD spectra of the PEG, PCM, and graphene/PCM composites are shown in FIGS. 12, 13 and 14, respectively. As shown in FIG. 12, sharp and intense diffraction peaks of PEG were observed at 2θ=19.12° and 23.24° for all three samples. This finding indicated that PEG crystalline phases were also present in the PCM and graphene/PCM composites.

Figure 15:
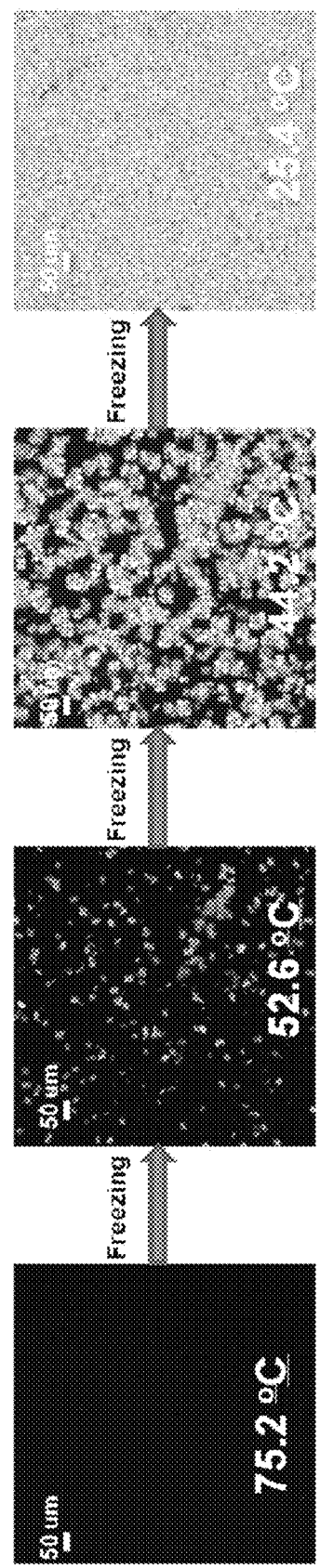
FIG. 15. The polarized microscope images of the PCM of Example 1 during the cooling process.
Figure 17:
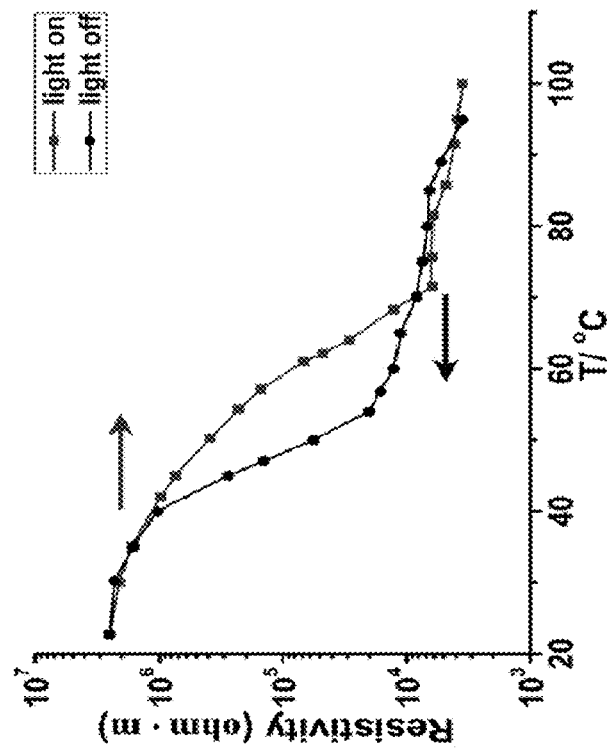
FIG. 17. Change in electrical resistivity as a function of temperature induced by light irradiation: 3 wt. % graphene/PCM nanocomposite.
Figure 16:
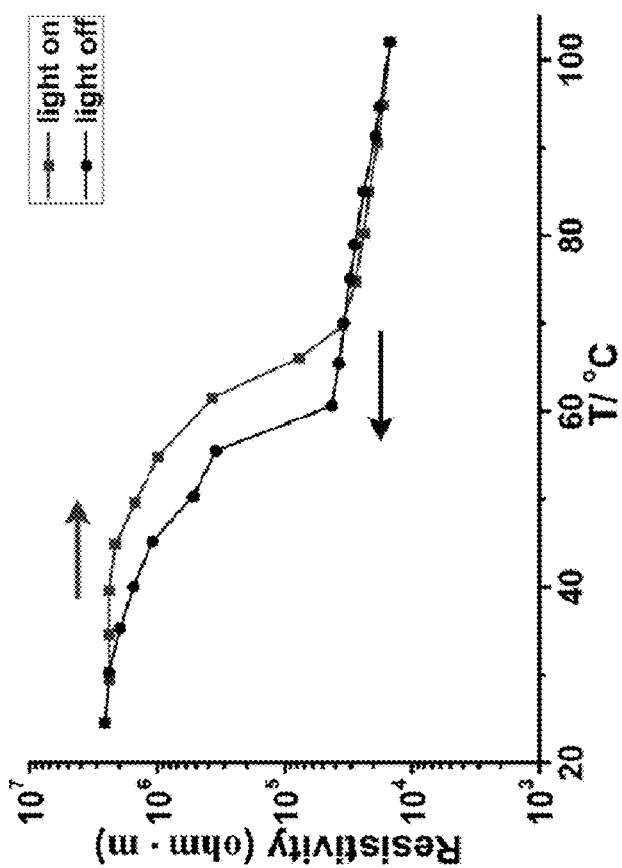
FIG. 16. Change in electrical resistivity as a function of temperature induced by light irradiation: 1 wt. % graphene/PCM nanocomposite.
Figure 19:
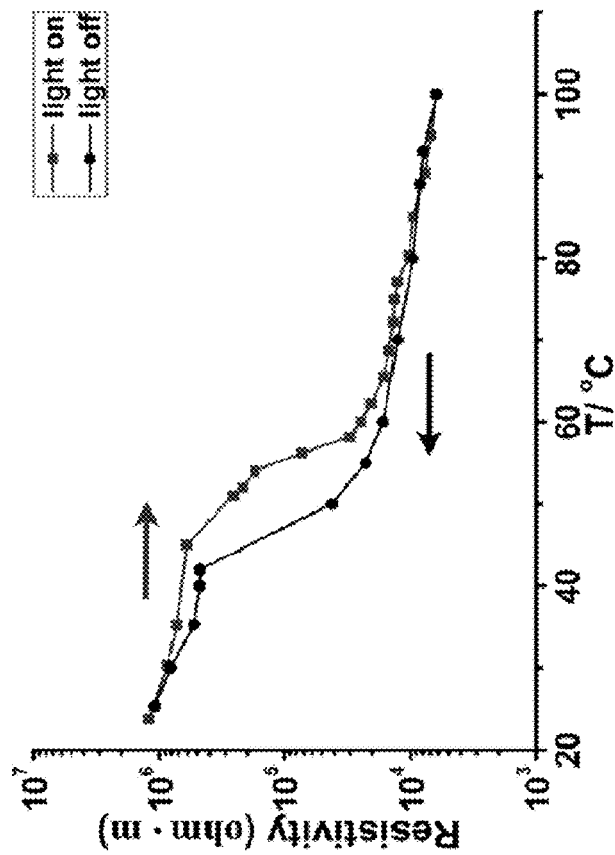
FIG. 19. Change in electrical resistivity as a function of temperature induced by light irradiation: 7 wt. % graphene/PCM nanocomposite.

To further investigate the effect of light irradiation on the PEG crystalline structure in the 5 wt. % graphene/PCM composite, a series of XRD scans were performed on the composite with light irradiation on (FIG. 13) and off (FIG. 14). Under light irradiation, the intensities of the two PEG diffraction peaks from the graphene/PCM composite decreased rapidly and finally became a broad weak peak, demonstrating that PEG phase transition occurred and the PEG crystalline domains were converted to an amorphous liquid state at the microscopic level. As evidenced by the UV-vis-NIR analysis, graphene in the graphene/PCM composites effectively absorbed the light, and consequently, the absorbed optical energy was converted to thermal energy, raising the temperature (room temperature (~23° C.) to 100° C.) of the nanocomposites and causing the phase transition of the PEG crystalline domains. Conversely, this broad peak was gradually transformed into two sharp diffraction peaks after removing the light source, which caused a decline in temperature, thereby triggering the PEG recrystallinzation process (FIG. 14). This observation illustrates that light can be an effective stimulus for reversibly controlling the phase transition behavior of the PEG crystalline microdomains in graphene/PCM nanocomposites. FIG. 15 shows the polarized light microscopy images of the PCM film at different temperatures during the cooling process. The crystalline PCM had a typical spherulite morphology.

The differential scanning calorimetry (DSC) curves of the PEG, PCM, and graphene/PCM composites were measured, and the enthalpies of the PEG phase transitions (i.e., the melting and recrystallization processes (FIG. 15) of the PEG crystalline microdomains in the PCM or composite) were calculated and are listed in Table 2.

TABLE 2

Phase-change behaviors of the PEG 20 kDa, PCM, and graphene/PCM nanocomposites.

| | | ΔH (J/g) | | Tm (° C.) | Tc (° C.) |
| --- | --- | --- | --- | --- | --- |
| Samples | Phase transition | Heating cycle | Cooling cycle | Heating cycle | Cooling cycle |
| PEG 20 kDa | Solid-liquid | 178.5 | 179.1 | 66.9 | 40.1 |
| PCM | Form-stable | 110.5 | 110.9 | 66.2 | 42.4 |
| 1 wt. % graphene/PCM | Form-stable | 108.2 | 108.6 | 64.3 | 44.8 |
| 3 wt. % graphene/PCM | Form-stable | 107.1 | 108.3 | 64.2 | 48.1 |
| 5 wt. % graphene/PCM | Form-stable | 102.5 | 102.3 | 64.6 | 45.1 |
| 7 wt. % graphene/PCM | Form-stable | 101.3 | 99.1 | 65.6 | 46.2 |
| 10 wt. % graphene/PCM | Form-stable | 94.2 | 93.1 | 65.3 | 46.8 |

The difference between the enthalpies of the PCM and graphene/PCM composites was relatively small, and the enthalpies of the PCM and graphene/PCM composites were significantly lower than that of the pure PEG. For instance, the melting enthalpies of the PEG 20 kDa, PCM, and 5 wt. % graphene/PCM composites were 178.5, 110.5, and 102.5 J/g, respectively. The reduction in the degree of PEG crystallinity observed in the PCM and graphene/PCM composites, in comparison with PEG alone, may be partially attributed to the interference and restriction of PEG crystallization by the other components in the PCM and graphene/PCM composites, including the TTI aromatic rings and the graphene. For instance, the melting enthalpies of the graphene/PCM composites generally showed a decreasing trend with an increasing graphene content (i.e., from 110.5, 108.2, 107.1, 102.5, 101.9, to 94.7 J/g corresponding to 0, 1, 3, 5, 7 and 10 wt. % graphene, respectively). In terms of the phase transition temperatures (i.e., the melting ($T_m$) and re-crystallization ($T_c$) temperatures), there was no consistent or significant change between the PCM and the graphene/PCM nanocomposites.

Figure 18:
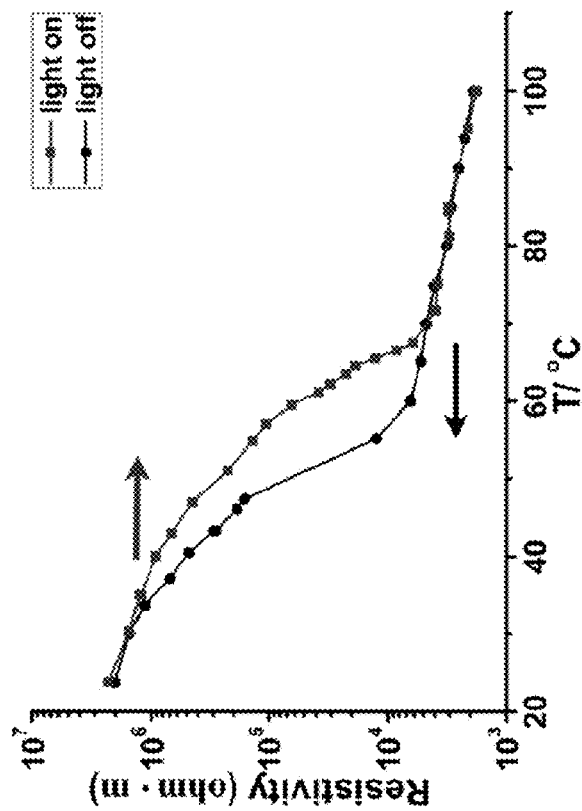
FIG. 18. Change in electrical resistivity as a function of temperature induced by light irradiation: 5 wt. % graphene/PCM nanocomposite.

FIGS. 16, 17, 18, 19, and 20 show the large reversible change of electrical resistivity during the phase transition process under light irradiation for nanocomposites comprising 1, 3, 5, 7 and 10 wt. % graphene, respectively. As the temperature increased from room temperature to 100° C. upon light irradiation, the electrical resistivity of the 5 wt. % graphene/PCM composite decreased by three orders of magnitude, and most of the reduction in electrical resistivity occurred during the phase transition process (from 44° C. to 65° C.) (FIG. 18, light-on). Similarly, the electrical resistivity increased by three orders of magnitude upon re-crystallization during cooling after removing the light source (FIG. 18, light-off). More importantly, the dramatic change in electrical resistivity within the phase transition region was achieved, while the graphene/PCM composite film retained its overall dimensions in its solid form during the entire heating and cooling process. In other words, unlike the PEG film, which changed from a solid phase to a liquid phase during phase transition, both the PCM and graphene/PCM composite films kept their macroscopic solid state during phase transition, a desirable characteristic of form-stable phase transition materials.

Figure 8:
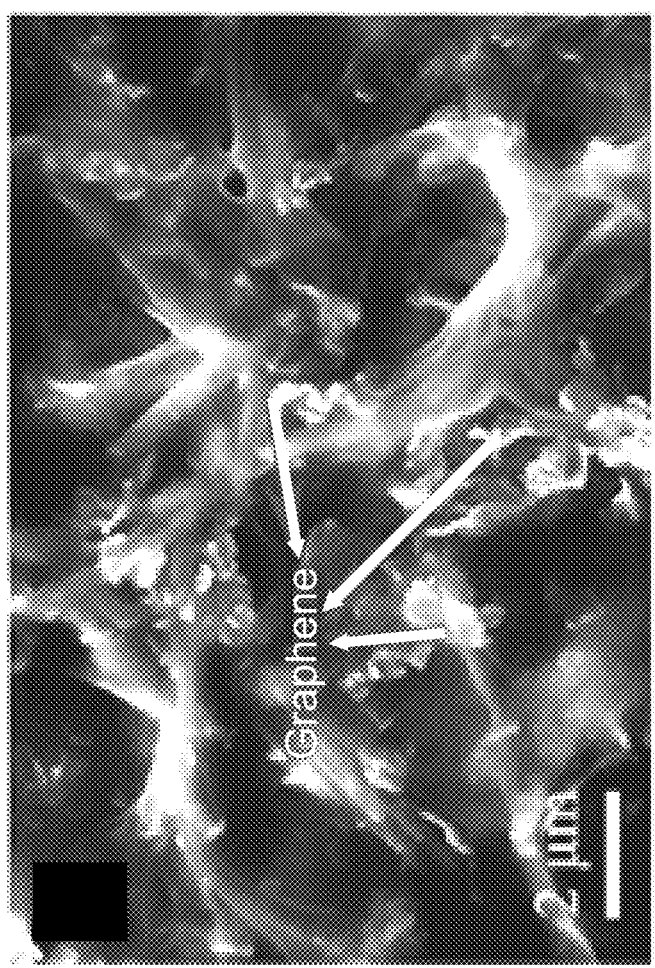
FIG. 8. SEM image of the 5 wt. % graphene/PCM nanocomposite (top-view of the nanocomposite film).
Figure 9:
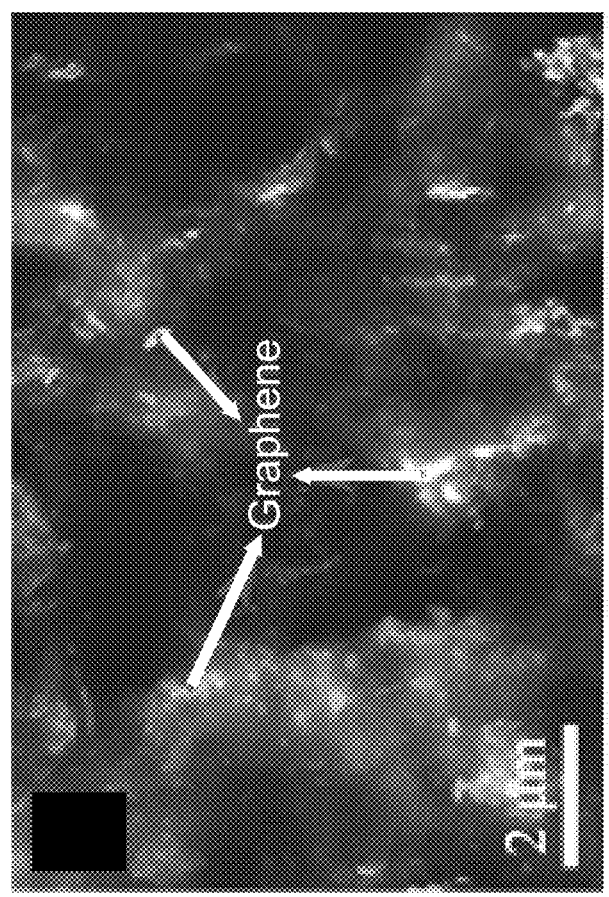
FIG. 9. SEM image of the 5 wt. % graphene/PCM nanocomposite (cross-section of the nanocomposite film).
Figure 10:
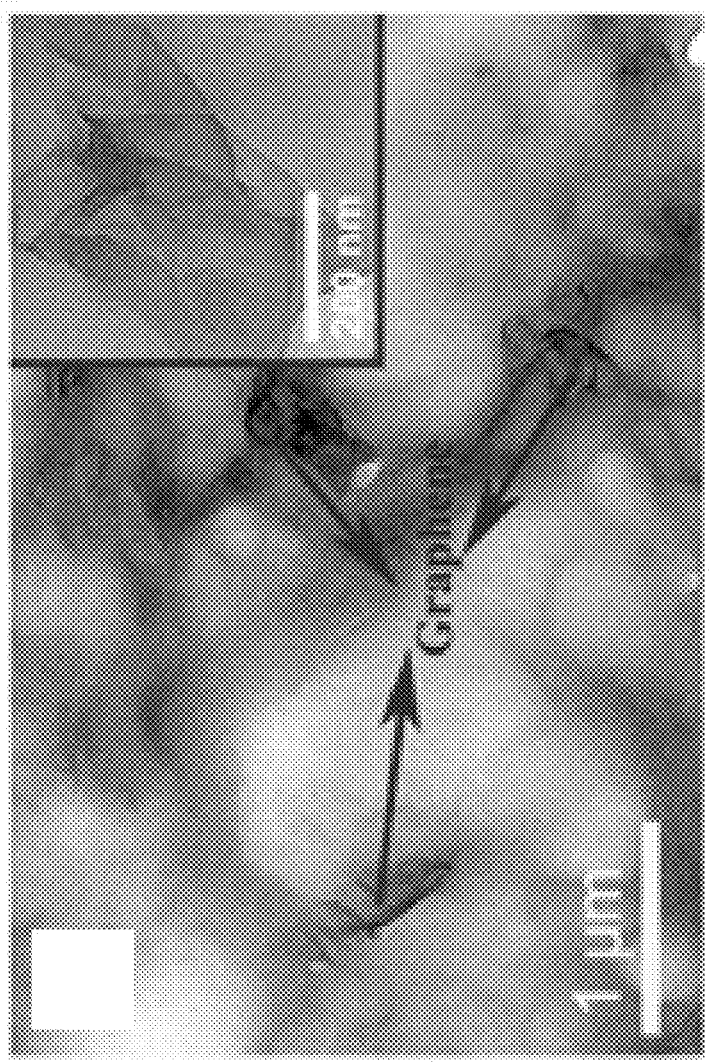
FIG. 10. TEM image of the 5 wt. % graphene/PCM nanocomposite (inset: TEM image of graphene in 5 wt. % graphene/PCM nanocomposite).

As shown in FIG. 8 and FIG. 9, SEM images of the graphene/PCM composite showed that the surface-functionalized graphene nanosheets were uniformly distributed in the PCM, while TEM images (FIG. 10) indicated that the graphene nanosheets were mostly distributed at the grain boundaries of the PCM matrix that comprised PEG crystalline microdomains. The uniform graphene dispersion shown in the SEM images can be attributed to the strong van der Waals forces present among PCM, toluene, and the nitrophenyl groups of the surface-functionalized graphene.

Typically, the electrical resistivity of polymer nanocomposites increases with temperature, which is referred to as the positive temperature coefficient (PTC) effect and has been explained using the conducting path network, tunneling effect, electric field emission, and thermal expansion effect. Under rare occasions as reported here, the electric resistivity decreases with temperature, which is referred to as the negative temperature coefficient (NTC) effect and has been linked to reaggregation or redistribution of conductive fillers above the polymer melting point. Whether the PTC or NTC effect dominates in a polymer nanocomposite depends on many factors including the type, morphology, surface chemistry, dispersion of the fillers, the intrinsic properties of the polymer matrices, as well as the interaction between the filler and the polymer matrix. In this example, the drastic change in electrical conductivity/resistivity observed during the phase transition can be mainly attributed to the internal stress generated during the phase transition that could modulate the electrical contact resistance and lead to a large contrast in the electrical resistivity. (See, Zheng, R.; Gao, J.; Wang, J.; Chen, G., Reversible temperature regulation of electrical and thermal conductivity using liquid-solid phase transitions. *Nat. Commun.* 2011, 2, 289-294.) As noted above, graphene nanosheets were uniformly distributed within the graphene/PCM composites according to SEM analysis and mostly along the grain boundaries of the insulating PCM matrix according to TEM analysis. It is likely that a conducting graphene network was not formed at room temperature due to the encapsulation of these graphene nanosheets by the insulating PCM matrix, thereby leading to a high electrical resistivity. Upon light irradiation, the PEG crystalline microdomains may melt and induce localized volume expansion and generate internal stress, which subsequently enhances the probability of forming a conductive graphene network and thus drastically reduces the electrical resistivity. In contrast, during the cooling process with the light irradiation off, the recrystallization of the PEG crystalline microdomains eliminated the internal stress generated during the melting process, which may have also reduced the probability of forming a conductive graphene network and hence induced a drastic increase in electrical resistivity. Outside the phase transition region, the microstructure of the composites was stabilized and thus less change in electrical resistivity was observed. Additionally, as shown in FIGS. 16-21, the electrical resistivities of the graphene/PCM composites with different graphene concentrations (e.g., 1, 3, 7, and 10 wt. %) demonstrated a similar trend as the graphene/PCM composite with 5 wt. % graphene (FIG. 18). Furthermore, the electrical resistivities of the graphene/PCM composites at room-temperature decreased with the graphene content (i.e., $2.59 \times 10^6$ $\Omega \cdot m$, $2.41 \times 10^6$ $\Omega \cdot m$, $2.02 \times 10^6$ $\Omega \cdot m$, $1.21 \times 10^6$ $\Omega \cdot m$, and $8.38 \times 10^5$ $\Omega \cdot m$ corresponding to 1, 3, 5, 7, and 10 wt. % graphene, respectively). However, the magnitude of change in electrical resistivity among these graphene/PCM varied significantly. The magnitude of change in electrical resistivity was 174, 783, 1100, 195, and 167 times, respectively, corresponding to 1, 3, 5, 7, and 10 wt. % graphene content in the graphene/PCM composites. In other words, the magnitude of change in electrical resistivity initially increased and then decreased with the graphene content. This finding may have been due to the fact that the electrical conductivity of the graphene/PCM composites were most sensitive to structural and internal stress changes when the graphene loading content was close to the electrical percolation threshold of the composites.

Figure 21:
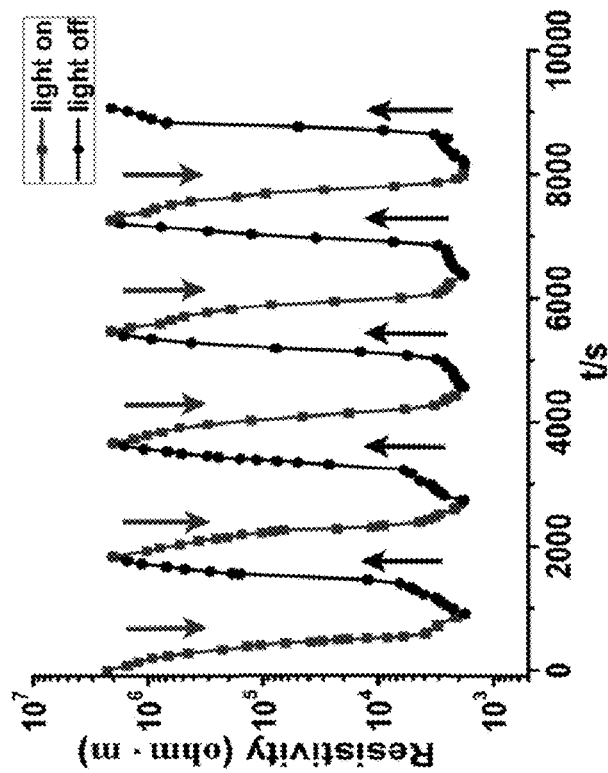
FIG. 21. Change in electrical resistivity as a function of temperature induced by light irradiation: 5 cyclic electrical resistivity measurements for the 5 wt. % graphene/PCM nanocomposite.
Figure 20:
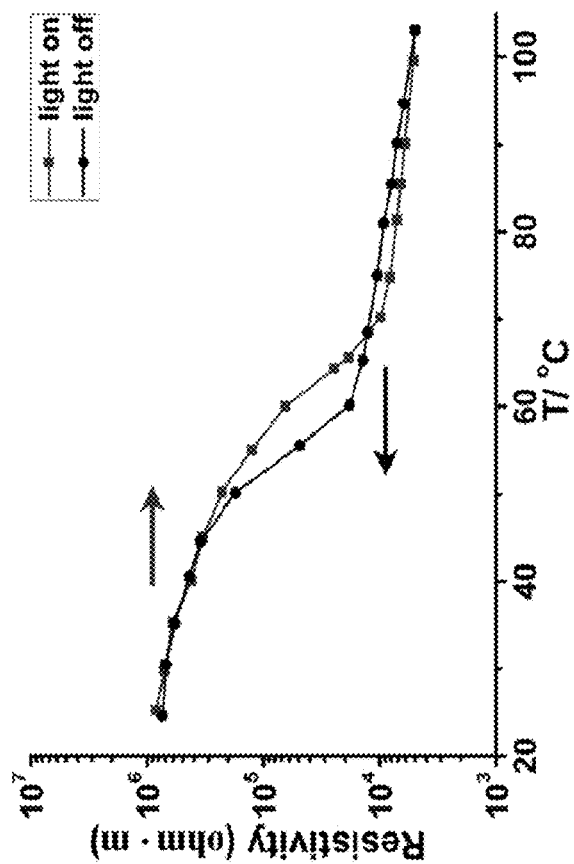
FIG. 20. Change in electrical resistivity as a function of temperature induced by light irradiation: 10 wt. % graphene/PCM nanocomposite.

To investigate the reproducibility of the reversible electrical resistivity regulation of the graphene/PCM composites, the electrical resistivities of the 5 wt. % graphene/PCM composite during five cycles of the melting-recrystallization processes induced by light irradiation were measured and are shown in FIG. 21. The 5 wt. % graphene/PCM composites demonstrated reliable reproducibility in achieving light-driven reversible electrical regulation for five heating-cooling cycles, suggesting that the composite has excellent thermal stability within the range of temperatures tested, as confirmed by the thermogravimetric analysis (TGA) below. As such, these graphene/PCM composites have a potential for long-term durable applications.

Thermal stability is of vital importance for polymers and polymer composites. TGA was used to study the thermal stability of PEG, PCM, and graphene/PCM composites. The thermal stability of the graphene/PCM decreased in comparison with the PCM. For example, the temperature corresponding to a 5 wt. % weight loss in the PCM (355.6° C.)

was higher than that of graphene/PCM (338.1° C.). The most significant degradation took place within the temperature range 372° C. to 406° C., which was due to the exothermic degradation and decomposition of the PEG chains. The amount of char yielded after 600° C. for the PEG, PCM, and 5 wt. % graphene/PCM composites was 0.3%, 0.4%, and 5.4%, respectively. The larger amount of char yield observed in the graphene/PCM can be attributed to the 5 wt. % graphene present in the composites.

In order to study the mechanical properties of the graphene/PCM composite, tensile tests were carried out according to ASTM: D882, and the results are shown in Table 3.

TABLE 3

Mechanical properties of the PCM and 5 wt. % graphene/PCM nanocomposites.

| Samples | Tensile strength at Break (MPa) | Tensile strain (Extension) at Break (mm/mm) | Young's Modulus (E-modulus) (MPa) |
| --- | --- | --- | --- |
| PCM | 20.45 ± 1.2 | 12.27 ± 1.1 | 57.79 ± 0.8 |
| 5 wt. % graphene/PCM | 16.98 ± 1.2 | 11.51 ± 0.4 | 57.26 ± 0.9 |

Both the tensile strength and strain-at-break of the 5 wt. % graphene/PCM decreased in comparison with PCM, which might have been due to the weak interactions between the graphene and the polymer matrix. However, the graphene/PCM nanocomposite still exhibited remarkable flexibility (with a strain-at-break of 1151%) and good tensile strength (16.98 MPa) and modulus (57.26 MPa).

Methods

Materials:

Polyethylene glycol (PEG 20 kDa) was purchased from Sigma-Aldrich (MO, USA) and was dried at 80° C. under high vacuum (0.012 MPa) for 48 h before use. Analytical grade toluene (Fisher Scientific, PA, USA) was dried for 48 h using a 5 Å molecular sieve and then distilled prior to use. The triphenylmethane triisocyanate (TTI, Boc Sciences, NY, USA) and dibutyl tin dilaurate (DBT, Alfa Aesar, Mass., USA) were used as received. N-dimethylformamide (DMF) and tetrahydrofuran (THF) were purchased from Sigma-Aldrich (MO, USA). Natural graphite powder was purchased from Fisher Scientific, PA, USA. All other reagents were of analytical grade.

Graphene:

Graphene oxide (GO) was synthesized from natural graphite powder using the modified Hummers method. (See, Hong, T.-K.; Lee, D. W.; Choi, H. J.; Shin, H. S.; Kim, B.-S., Transparent, Flexible Conducting Hybrid Multilayer Thin Films of Multiwalled Carbon Nanotubes with Graphene Nanosheets. *ACS Nano* 2010, 4, 3861-3868 and Kotal, M.; Bhowmick, A. K., Multifunctional Hybrid Materials Based on Carbon Nanotube Chemically Bonded to Reduced Graphene Oxide. *J. Phys. Chem. C* 2013, 117, 25865-25875.) GO (100 mg) and deionized water (10 mL) were placed in a 250 mL round-bottom flask and the mixture was sonicated for 1 h. After that, 90 mL DMF was added into the flask and the mixture was sonicated for another 2 h. Then, the mixture was centrifuged at 4,000 rpm to remove non-dispersed particles and the homogeneous supernatant dispersion was collected. 1 ml hydrazine was subsequently added to the supernatant dispersion. The mixture was refluxed in a water bath around 85° C. for 24 h. Finally, the resulting reactive mixture was filtered and washed three times by 30 ml DMF and 45 ml DI water, respectively.

Synthesis of the Surface Functionalized Graphene:

Graphene was functionalized with 4-nitrophenyl moieties according to a method described in the literature. (See, Lomeda, J. R.; Doyle, C. D.; Kosynkin, D. V.; Hwang, W. F.; Tour, J. M., Diazonium Functionalization of Surfactant-Wrapped Chemically Converted Graphene Sheets. *J. Am. Chem. Soc.* 2008, 130, 16201-16206 and Wang, Q. H.; Shih, C.-J.; Paulus, G. L. C.; Strano, M. S., Evolution of Physical and Electronic Structures of Bilayer Graphene upon Chemical Functionalization. *J. Am. Chem. Soc.* 2013, 135, 18866-18875.) The synthetic process for preparing the surface-functionalized graphene is shown in FIG. 4A. Functionalization of graphene was conducted by dispersing 100 mg of graphene in 50 mL of deionized water, adding 10 mmol 4-nitroaniline, followed by 12 mL of concentrated hydrochloric acid, and finally 10 mmol sodium nitrite. The mixture was ultrasonicated at 300 W for 4 h at 55° C., and stirred overnight at ambient temperature. It was then filtered and washed successively with water and ethanol. The resulting surface-modified graphene was dried overnight in a vacuum oven.

Synthesis of the Form-Stable PCM:

The synthesis route for preparing the PCM is shown in FIG. 5 (Step 2). The synthesis reaction was conducted in a flame-dried glassware in an inert nitrogen ($N_2$) atmosphere. First, 2.0 g of dried PEG 20 kDa, 24.5 mg TTI, and 1 mg dibutyl tin dilaurate (DBT) were mixed in freshly distilled toluene and stirred for 6 h in an $N_2$ atmosphere at 80 to 85° C. to obtain the hyperbranched polymer; i.e., the form-stable PCM.

Synthesis of the Graphene/PCM Nanocomposites:

A specific amount of the surface-modified graphene and the above-obtained PCM toluene solution were mixed and thoroughly stirred. The mixture was ultrasonicated at 300 W for 30 min at 80° C. to obtain a well-dispersed suspension. The resulting solution was evaporated at 90° C. to produce the graphene/PCM nanocomposite film. The graphene/PCM nanocomposite film was further dried for 48 h at 80° C. under vacuum (0.0014 mBar).

Characterization

The chemical structure of the graphene, PCM, and graphene/PCM nanocomposites were analyzed using a Fourier transform infrared (FTIR) spectrophotometer (Bruker Tensor 27 FT-IR) and a Bruker DPX 300 proton nuclear magnetic resonance spectrometer ($^1$H NMR, DMSO-$d_6$, with TMS as the internal standard) at room temperature. For the measurement of light-driven electrical resistivity regulation, a Fisher Scientific microscope fiber-optic light (No. 112-562-21) was used as a light irradiation source. A HP4155 semiconductor analyzer was used to measure the electrical resistivity of the samples. A thermometer with K-type thermocouple was used to record the temperature of the samples during light irradiation. Light irradiation was set for the samples to achieve a steady temperature increase/decrease rate (approximately 5° C./min). A silver wire detector was set underneath the samples in order to measure the temperature accurately. Scanning electron microscopy (LEO GEMINI 1530 SEM, Zeiss, Germany) and transmission emission microscopy (TEM, FEI Tecnai T12) were used to characterize the microstructure of the graphene/PCM nanocomposites. For TEM analysis, the sample (about 50 nm in thickness) was prepared using a microtome (Reichert UltraCut E, NY USA). Differential scanning calorimetry (DSC) was performed in an $N_2$ atmosphere using a Q20 DSC thermal analyzer (TA Instruments, DE USA) from 0 to 80° C. at a heating rate of 5° C./min and a $N_2$ flow rate of 20 mL/min. The DSC sample (about 5.0 mg) was stored in a sealed aluminum pan. The latent heat was calculated as the total area under the transition peaks of the graphene/PCM nanocomposites using thermal analysis software. To study the effect of temperature on the dimension/shape of the graphene/PCM nanocomposite films, digital images of these films were taken periodically while they were heated on a hot stage from 30 to 100° C. at a rate of 5° C./min. The thermal stability of these films were characterized via thermogravimetric analysis (TGA) using a TGA/Q50 thermal analyzer (TA Instruments, DE USA). Approximately 10 mg of the nanocomposite films were heated from 30 to 600° C. at a heating rate of 10° C./min in an $N_2$ atmosphere. X-ray diffraction (XRD, Bruker D8-Discovery) analysis was performed on the samples within 5° to 80° (diffraction angles, 2θ). Prior to the XRD analysis, the time it took to reach a specific temperature (from room temperature to 100° C.) for the sample set on the XRD stage during light irradiation was measured using a thermometer with a K-type thermocouple. Its silver wire detector was put just beneath the sample. According to the irradiation time-temperature correlation obtained from this measurement, the XRD analysis was then carried out on the sample under the same light illumination condition except that the silver wire detector beneath the sample was being removed. UV-vis-NIR absorbance was measured using a Varian Cary 5000 Bio UV-visible-NIR spectrophotometer. The tensile properties of the films were characterized according to ASTM: D882 using a universal testing machine (Instron 5967, PA USA). The tensile strain rate was set at 10% $min^{-1}$ for the tests. A Fisher Scientific microscope fiber-optic light (No. 112-562-21) was employed as the illumination source. The polarized optical images for crystalline PEG were taken using a polarized light microscope (EN60950, Diagnostic Instruments Inc, MI, USA).

The graphene/PCM composites described here are also described in Wang et al., ACS Appl. Mater. Interfaces 2015, 7, 2641-2647, the entire disclosure of which is incorporated herein by references.

Example 2

This example illustrates a family of unique nanocomposite films comprising MWCNTs distributed in a form-stable phase PCM that exhibited rapid, dramatic, reversible, and cyclic IR-regulated responses in air. The 3 wt. % MWCNT/PCM nanocomposite films demonstrated cyclic, IR-regulated on/off electrical conductivity ratios of 11.6±0.6 times and 570.0±70.5 times, respectively, at an IR power of 7.3 and 23.6 $mW/mm^2$. The excellent performances exhibited by the MWCNT/PCM nanocomposite films were largely attributed to the IR-regulated cyclic and reversible form-stable phase transitions occurring in the PCM matrix due to MWCNT's excellent photoabsorption and thermal conversion capabilities, which subsequently affected the thickness of the interfacial PCM between adjacent conductive MWCNTs and thus the electron tunneling efficiency between the MWCNTs. These unique MWCNT/PCM nanocomposites offer new options for high-performance and flexible optoelectronic devices including thermal imaging, IR sensing and optical communication.

This example further illustrates a simple and versatile method of fabricating nanocomposite thin films comprising MWCNTs distributed in a form-stable phase change material (PCM).

Results and Discussion

Figure 22B:
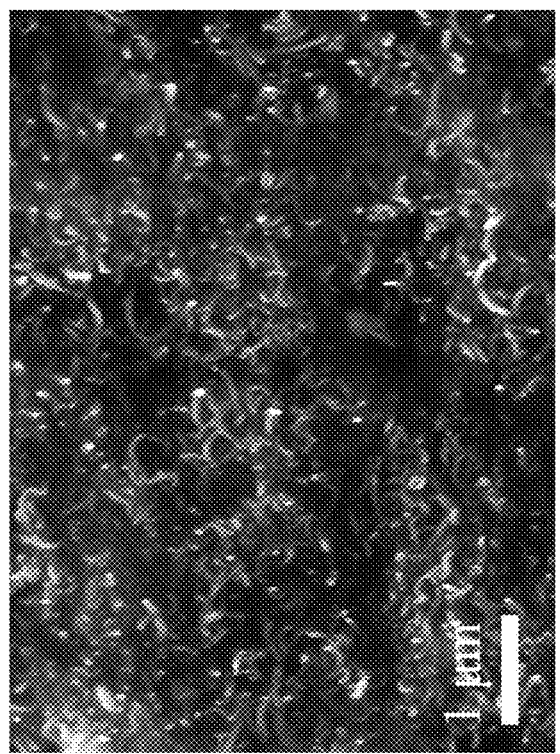
FIG. 22B. SEM image (cross-section view) of the 3 wt. % MWCNT/PCM nanocomposite film.
Figure 22A:
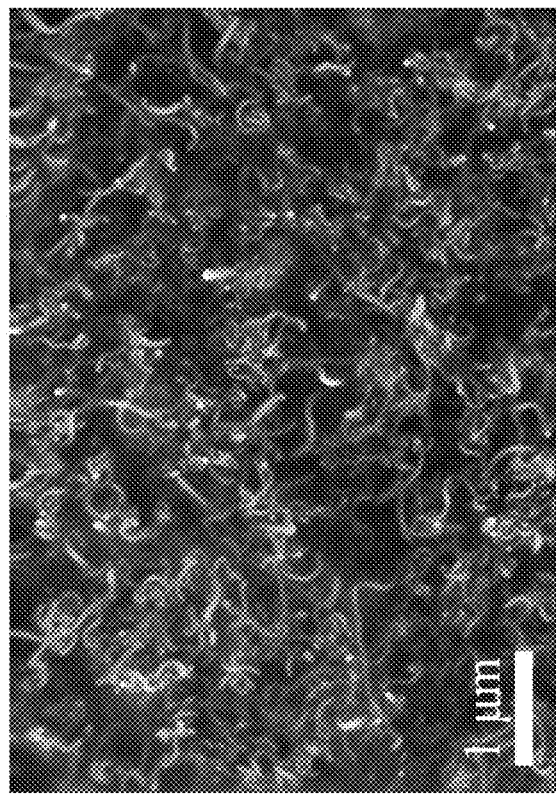
FIG. 22A. SEM image (Top view) of the 3 wt. % MWCNT/PCM nanocomposite film.

CNTs with high aspect ratios tend to form bundles and entanglements due to their strong intertube van der Waals interactions. Therefore, it is challenging to produce uniform CNT dispersion in organic solvents and polymer matrices, which hinders their applications. Scheme 1 in FIG. 5 shows the schematic representation of the fabrication process for the MWCNT/PCM nanocomposite films. In order to obtain MWCNT/PCM nanocomposite films with evenly distributed MWCNTs, MWCNTs were functionalized with p-methoxyphenyl diazonium salts (Step 1). The p-methoxyphenyl functionalized MWCNTs had excellent dispersibility in DMF, which was one of the two solvents used to prepare the MWCNT/PCM nanocomposite films. The form-stable PCM was synthesized with the di-functional polyethylene glycol (PEG, 6 kDa) and tri-functional triphenylmethanetriisocyanate (TTI) (Step 2). FIGS. 22A and 22B are the top view and cross-section view of the MWCNT/PCM nanocomposite film under SEM which indicate that the MWCNTs were evenly distributed in the PCM matrix. This is essential in order to obtain reproducible and consistent material properties including electrical conductivity. The uniform dispersion of the MWCNTs in the PCM matrix was mainly attributed to the strong van der Waals forces present among PCM, toluene, and the p-methoxyphenyl groups of the surface-functionalized MWCNTs. Observations of the macroscopic morphology of the films formed by pure PEG (6 kDa), PCM, and 3 wt. % MWCNT/PCM nanocomposite at different temperatures show that, unlike the pure PEG film that exhibits a clear solid-to-liquid phase transition when the temperature was increased from room temperature to 65.0° C. and then 100.0° C., both the PCM film and the MWCNT/PCM nanocomposite film exhibited form-stable phase transitions, namely, these films retained a solid form at the macroscopic level during the microscopic and localized PEG crystallite melting process since the PEG molecules formed crosslinks with the tri-functional TTI, the other component within the PCM structure. FIGS. 23A and 23B show the TEM images for the same location of the MWCNT/PCM nanocomposite before (FIG. 23A) and after (FIG. 23B) the IR illumination (23.6 $mW/mm^2$ for 10 sec) at room temperature. These TEM images taken at room temperature did not show any apparent changes in the distribution of the MWCNTs in the MWCNT/PCM nanocomposite before and after the IR illumination. This suggests that the change in the microstructure of the nanocomposite induced by IR irradiation was recovered upon the removal of the IR light, which is consistent with the reversible electrical conductivity regulation observed during the multiple cycles of IR irradiation, discussed below.

Figures 24A, 24B:
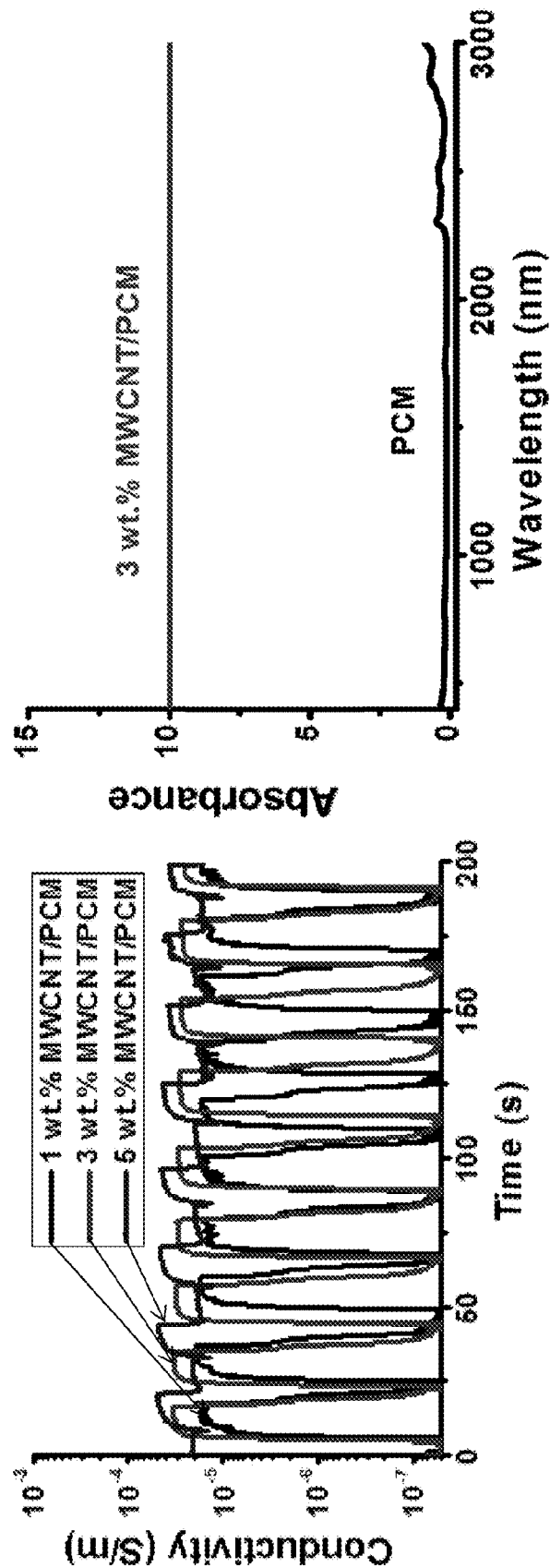
FIG. 24A. The cyclic electrical conductivity responses of the three types of MWCNT/PCM nanocomposite films with 1, 3, and 5 wt. % MWCNTs, respectively, to IR illumination (23.6 mW/mm$^2$, sample size: 0.5×0.5×0.15 mm$^3$).
FIG. 24B. IR absorbance spectra of the PCM and 3 wt. % MWCNT/PCM nanocomposite film.

The nanocomposite films demonstrated a dramatic, reversible, cyclic, and rapid IR photoresponse in electrical conductivity. FIG. 24A shows the real time cyclic IR photoresponse of the MWCNT/PCM nanocomposite films with different MWCNT loading contents; i.e., 1, 3, and 5 wt. % in air (power density: 23.6 $mW/mm^2$, sample size: 0.5×0.5×0.15 $mm^3$). Although all three types of nanocomposite films demonstrated a similar trend in IR responses—namely, the electrical conductivity increased upon IR illumination and then decreased after IR removal—the magnitude of the changes in the electrical conductivity varied significantly with the loading content of MWCNTs. More specifically, the on/off (in terms of IR illumination) electrical conductivity ratios were 418.0, 570.0, and 2.4, corresponding to 1, 3, and 5 wt. % MWCNT content in the nanocomposites, respectively. The initial electrical conductivity of the MWCNT/PCM nanocomposite films was measured at room temperature before IR illumination. The 3 wt. % nanocomposite films had an initial electrical conductivity only slightly higher than that of the 1 wt. % nanocomposite films.

However, the initial electrical conductivity of the nanocomposite films with 5 wt. % MWCNT was two orders of magnitude higher than that of the nanocomposite films with 1 and 3 wt. % MWCNT, suggesting that the 5 wt. % nanocomposite had already reached the electrical percolation threshold. Namely, the 5 wt. % nanocomposite film already had a good electrical conductive path before IR illumination. The electrical conductivity of the conductive nanofiller/polymer nanocomposites is more sensitive to the structural change of the conductive nanofiller network induced by various factors such as an internal stress when the conductive nanofiller loading content is close to the electrical percolation threshold. This could explain why the on/off (in terms of IR illumination) electrical conductivity ratios of the nanocomposite films initially increased (from 418.0 to 570.0 for 1 and 3 wt. % MWCNTs) and then decreased (from 570.0 to 2.4 for 3 and 5 wt. % MWCNTs) with the MWCNT loading content. Another observation with the cyclic IR response under repeated on/off IR illumination shown in FIG. 24A was that the profile features of all cycles measured were virtually identical. These cyclic performances reflected the excellent reversibility and reliability of the MWCNT/PCM nanocomposite films.

Figure 24C:
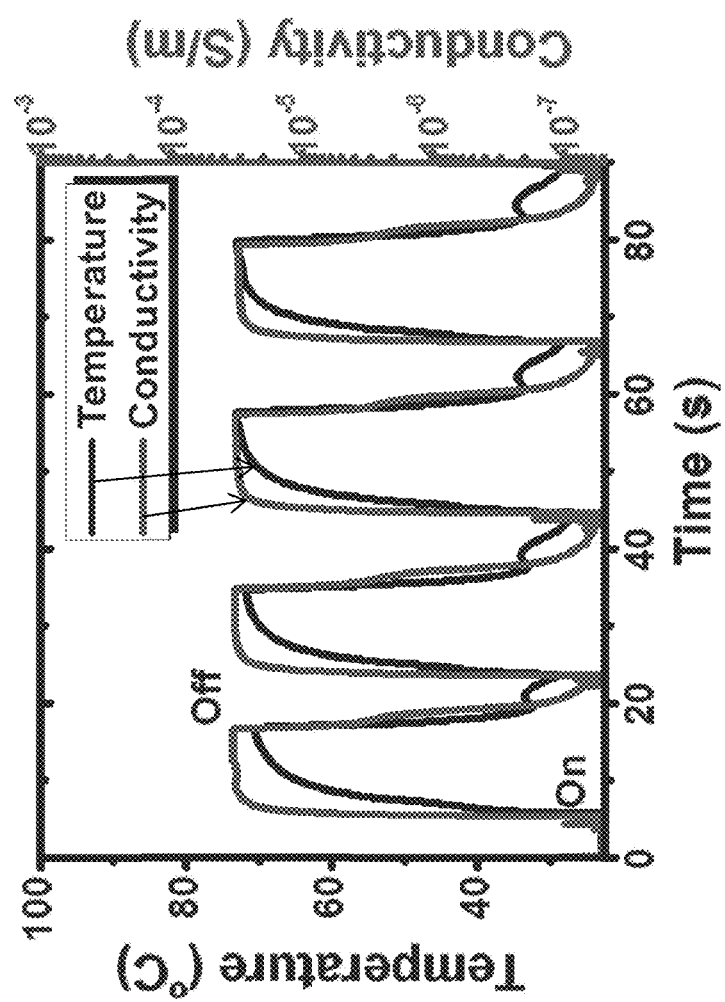
FIG. 24C. The cyclic electrical conductivity and temperature responses of the 3 wt. % MWCNT/PCM nanocomposite film to IR (23.6 mW/mm$^2$, sample size: 0.5×0.5×0.15 mm$^3$).

It is well known that CNTs can absorb IR light efficiently and, consequently, convert photoenergy to thermal energy, thereby causing an increase in the temperature of the CNT/polymer nanocomposites. Indeed, as shown in FIG. 24B, the MWCNT/PCM nanocomposite films had excellent IR absorbance. FIG. 24C shows the combined real-time cyclic temperature and electrical conductivity changes of the nanocomposite films modulated via on/off IR illumination (23.6 mW/mm$^2$). The temperature response matched with the electrical conductivity response reasonably well. Under IR illumination, the temperature of the nanocomposite rapidly increased from room temperature (~23.0° C.) to approximately 72.0° C. in about 12 sec. Furthermore, although the temperature of the 3 wt. % MWCNT/PCM nanocomposite film exceeded the melting temperature of PEG crystallites in the nanocomposite (i.e., 62.6° C.) as measured by DSC (Table 4), the film remained solid at a macroscopic level during the entire heating process despite the localized melting of the PEG crystallites.

After IR was turned off, the temperature of the nanocomposite film immediately dropped from its peak temperature. It is also interesting to note that near the end of the cooling process (upon IR removal), there was a small temperature bump around 33.7° C. This was caused by the exothermic PEG recrystallization process that occurred during the cooling process. X-ray diffraction (XRD) patterns of the PEG and 3 wt. % MWCNT/PCM nanocomposite confirmed the presence of PEG crystallites in the nanocomposite film. As presented in Table 4, the degrees of PEG crystallinity in the MWCNT/PCM nanocomposites ranged from 51 to 53%.

TABLE 4

Phase-change behaviors of PEG 6 kDa, PCM, and MWCNT/PCM nanocomposites.

| Sample | ΔH (J/g) Heating cycle | ΔH (J/g) Cooling cycle | $\chi_m$ (%) Heating cycle | $\chi_c$ (%) Cooling cycle | $T_m$ (° C.) Heating cycle | $T_c$ (° C.) Cooling cycle |
|---|---|---|---|---|---|---|
| PEG (6 kDa) | 176.4 | 172.7 | 88.8 | 87.1 | 65.3 | 39.6 |
| PCM | 105.1 | 104.6 | 55.1 | 54.8 | 59.2 | 39.8 |
| 1 wt. % MWCNT/PCM | 100.9 | 99.8 | 53.3 | 52.9 | 62.5 | 38.2 |
| 3 wt. % MWCNT/PCM | 97.4 | 96.6 | 52.7 | 52.3 | 62.6 | 38.7 |
| 5 wt. % MWCNT/PCM | 92.6 | 92.7 | 51.2 | 51.2 | 61.1 | 38.9 |

ΔH = enthalpy for the phase transitions; $\chi$ = ΔH/ΔH$^0$ (ΔH$^0$ = enthalpy of 100% crystalline PEG, 196.8 J/g); $\chi_m$ = the degree of PEG crystallinity during the heating cycle; $\chi_c$ = the degree of PEG crystallinity during cooling cycle; $T_m$ = melting peak temperature; $T_c$ = crystallization peak temperature.

Figure 25:
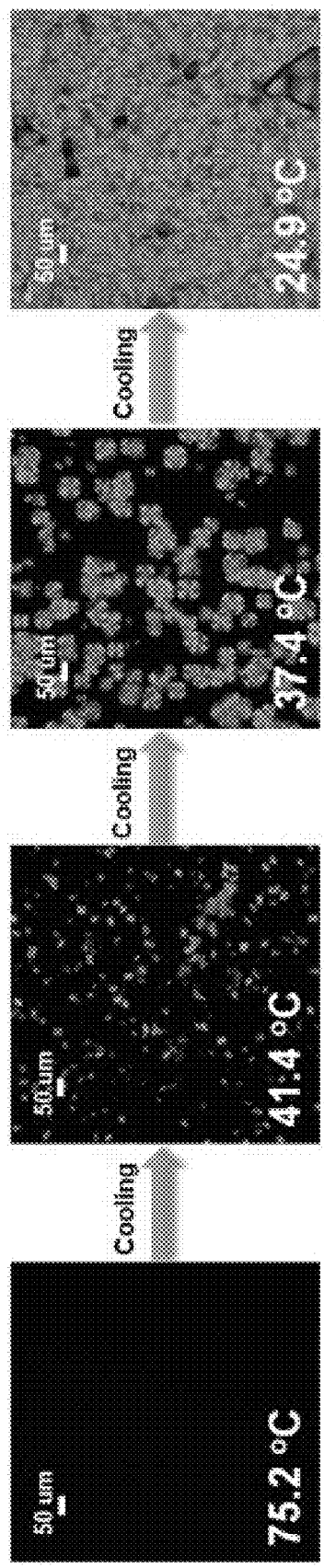
FIG. 25. Polarized microscope images of the PCM during the cooling process. The degree of PEG crystallinity in the PCM alone was 58.4%.

The dramatic, reversible, and cyclic IR photoresponses (up to 57,000%) observed in the MWCNT/PCM nanocomposite films can be attributed to the effect of the reversible localized PEG melting and re-crystallization phase transition processes regulated by IR illumination on the thickness of the interfacial PCM between adjacent conductive MWCNTs and, thus, the electron tunneling efficiency between the MWCNTs in the PCM matrix. To further demonstrate the phase change effect on the IR photoresponse, the formation of the PEG crystallites in the pure PCM during the cooling process was observed using a polarized microscope as shown in FIG. 25. During the cooling process, spherulite-like PEG crystallites were formed whose sizes were dependent on the cooling rate. As shown in Table 4, the recrystallization temperatures ($T_c$) of the MWCNT/PCM nanocomposites during cooling were lower than that of the pure PCM and the degrees of PEG crystallinity of the nanocomposites (both $\chi_m$ and $\chi_c$) were also lower than that of the PCM. These findings are consistent with the previous reports that nanoparticles including MWCNT and montmorillonite do not act like nucleating agents in the PEG matrix. (See, Strawhecker, K. E.; Manias, E., Crystallization behavior of poly(ethylene oxide) in the presence of Na plus montmorillonite fillers. *Chem. Mater.* 2003, 15, 844-849.) Therefore, MWCNTs were largely distributed within the crosslinked (as shown in FIG. 5, TTI is tri-functional) non-crystalline regions surrounding the localized PEG crystalline regions. This observation is further supported by the TEM images taken at room temperatures (FIGS. 23A and 23B) suggesting no apparent change in the distribution of the MWCNTs before and after the cyclic IR irradiation. If the MWCNTs were present in the PEG crystalline regions that undergo the melting process during the cyclic IR irradiation process, the distribution of the MWCNTs taken at room temperature would likely be changed after the cycle. In contrast, if the MWCNTs were distributed in the crosslinked elastic regions that do not undergo the melting process during the cyclic IR irradiation process, it is then not surprising to find that the MWCNT distribution before and after the cyclic IR irradiation taken at room temperature did not change.

FIG. 7 is a schematic representation of the potential effect of cyclic PEG melting and recrystallization (i.e., localized and microscopic PEG crystallites melting upon IR irradiation or recrystallizing within the MWCNT/PCM nanocomposite upon IR removal) on the distribution of the conductive MWCNT network within the PCM matrix. During the heating process (i.e., upon IR illumination), the microscopic and localized PEG crystalline regions within the PCM matrix melted, thereby leading to a localized volume expansion and subsequently generating a compressive internal stress on the crosslinked elastic regions where the MWCNTs resided. The densities of the crystalline PEG regions at room temperature and the PEG melts (around 68.0° C.) are approximately 1.243 g/ml and 1.086 g/ml, respectively, thus, the localized volume expansion induced by the localized and microscopic PEG melting was approximately 14.5%. (See, Seo, A.; Schaefer, T., Melt agglomeration with polyethylene glycol beads at a low impeller speed in a high shear mixer. *Eur. J. Pharm. Biopharm.* 2001, 52, 315-325.) Due to the presence of this compressive internal stress, the thickness of the interfacial PCM between adjacent conductive MWCNTs was reduced, leading to an enhanced electron tunneling efficiency between the MWCNTs and subsequently a drastic increase in the electrical conductivity of the MWCNT/PCM nanocomposite film. During the cooling process (i.e., upon the removal of the IR light), the molten PEG regions recrystallized, thereby eliminating the compressive internal stress experienced by the crosslinked elastic regions that was generated during the IR heating process, which subsequently increased the thickness of the interfacial PCM between adjacent conductive MWCNTs, thereby leading to a reduction in the electron tunneling efficiency between the MWCNTs, and hence a decrease in the electrical conductivity.

Figure 24D:
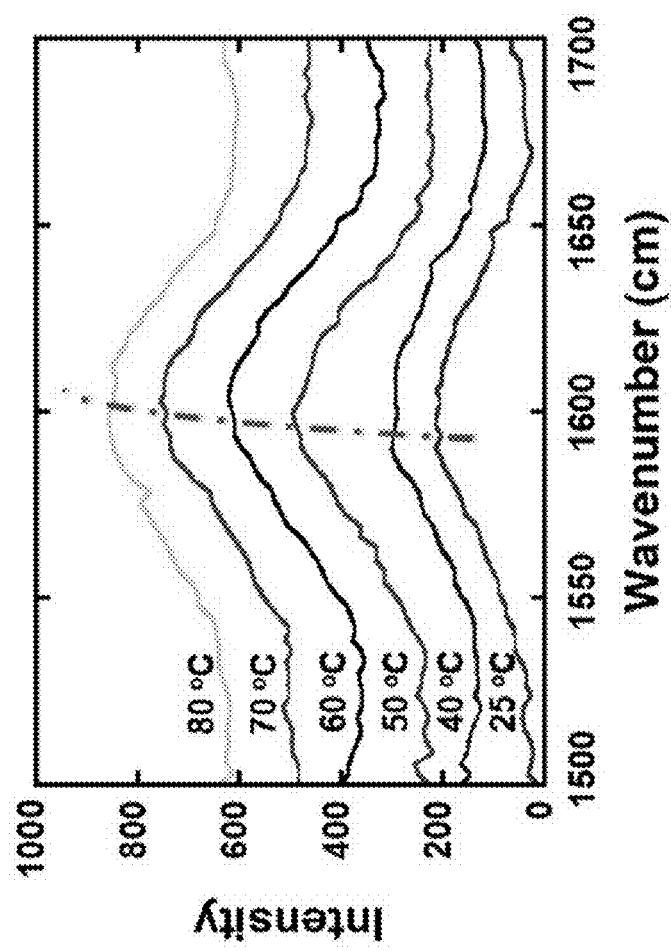
FIG. 24D. The Raman spectra of the 3 wt. % MWCNT/PCM nanocomposite taken at different temperatures.

This proposed mechanism for the IR induced cyclic and dramatic electrical conductivity regulation observed in the MWCNT/PCM nanocomposites was further supported by the Raman analyses. The G band of MWCNTs, a measure of its phonon vibration mode, is sensitive to stress applied to the MWCNTs. In response to the stress, the G band position of MWCNTs shown in the Raman spectrum was shifted. FIG. 24D shows the spectra of the MWCNT/PCM nanocomposites taken at different temperatures. As shown in FIG. 24D, the G band peaks of the MWCNTs in the Raman spectra at 1590.0 cm$^{-1}$ upshifted about 10.6 cm$^{-1}$ when the temperature increased from room temperature to 70.0° C., suggesting that the MWCNTs in the MWCNT/PCM nanocomposites were subjected to a compressive stress during the heating process. According to a previous systematic study, the pressure/stress coefficient of the MWCNTs' G band peak was 4.25 cm$^{-1}$/GPa. (See, Thomsen, C.; Reich, S.; Jantoljak, H.; Loa, I.; Syassen, K.; Burghard, M.; Duesberg, G. S.; Roth, S., Raman spectroscopy on single- and multi-walled nanotubes under high pressure. *Appl. Phys. a-Mater.* 1999, 69, 309-312.) Consequently, the magnitude of the compressive internal stress generated during the PEG melting process that was exerted on the MWCNTs embedded in the crosslinked elastic regions was calculated to be 2.49 GPa at 70.0° C. In other words, the Raman analyses confirmed the presence of a compressive internal stress generated during the IR heating process due to due to volume expansion resulting from the melting of the PEG crystalline regions. Furthermore, the similar trends exhibited by the IR responses of the temperature and electrical conductivity, as shown in FIG. 24C, further supports this proposed mechanism. Lastly, it is worth noting that such a dramatic cyclic IR response in electrical conductivity induced by cyclic phase transitions regulated by IR illumination was achieved while the MWCNT/PCM nanocomposite film retained its overall solid form during the entire heating and cooling process. Such form-stable IR responsive materials offer additional advantages which may lead to simplified manufacturing processes and less contingent requirements for device packaging.

FIG. 26A presents the dependence of the electrical conductivity regulation on the incident IR power density for the nanocomposite films with different MWCNT loading contents (i.e., 1 and 3 wt. %) or different sample sizes (i.e., 0.5×0.5 mm$^2$ or 1.0×1.0 mm$^2$). Overall, the photoresponses of the electrical conductivity ratios for the 1 wt. % nanocomposites were smaller than those of the 3 wt. % nanocomposites, suggesting that the 3 wt. % nanocomposites had a better final conductive network under IR illumination than the 1 wt. % nanocomposites, as discussed previously. The on/off electrical conductivity ratios increased with the IR power density in a nearly logarithmic linear fashion for both types of nanocomposites (i.e., 1 and 3 wt. % MWCNTs with a sample size of 0.5×0.5 mm$^2$). For instance, for the 3 wt. % nanocomposite, the on/off electrical conductivity ratios corresponding to IR power densities of 2.2, 7.3, and 23.6 mW/mm$^2$ were 1.8, 11.6, and 570.0 times, respectively. FIGS. 26B and 26C show the photoresponses of the on/off electrical conductivity ratios and the corresponding temperature profiles of the 3 wt. % nanocomposites with a sample size of 0.5×0.5 mm$^2$ at IR power densities of 2.2 and 23.6 mW/mm$^2$, respectively. At an IR power density of 2.2 mW/mm$^2$, the maximum temperature of the nanocomposite film was only 31.2° C., which was well below the peak melting temperature of the PEG crystallites (Table 4). In contrast, at an IR power density (23.6 mW/mm$^2$), the maximum temperature of the nanocomposite film reached about 72.0° C., suggesting that the degree of the PEG phase change should be much higher at a higher incident IR power density compared with the lower incident IR power density. This comparison validates the concept that the dramatic on/off electrical conductivity ratios observed for the 3 wt. % nanocomposite films at 23.6 mW/mm$^2$ (i.e., 570.0 times) were largely due to the cyclic melting and recrystallization phase transition behavior.

Figure 26D:
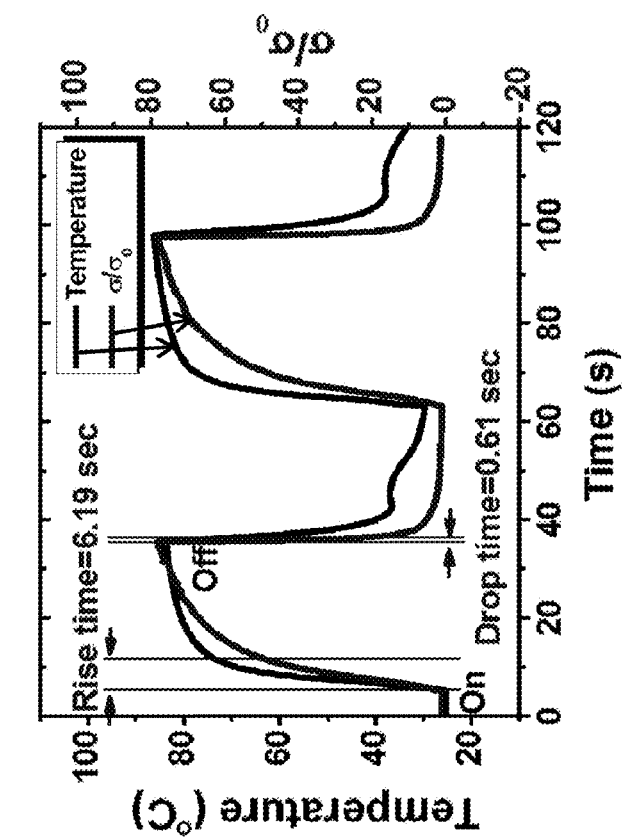
FIG. 26D. The photoresponses of the on/off electrical conductivity ratios ($\sigma/\sigma_0$) and temperature profiles of the 3 wt. % MWCNT/PCM nanocomposite at an IR power density of 23.6 mW/mm$^2$, size: 1.0×1.0 mm$^2$. Note: The rise time represents the time it takes for the response to reach 63.2% of its final value during the heating process. The drop time represents the time it takes for the response to reach 36.8% of its initial value during the cooling process.
Figure 26C:
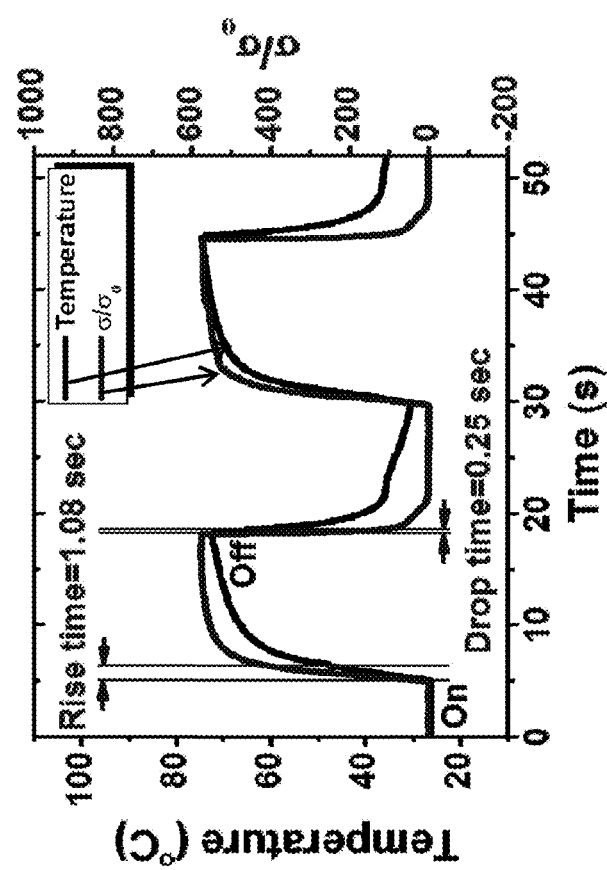
FIG. 26C. The photoresponses of the on/off electrical conductivity ratios ($\sigma/\sigma_0$) and temperature profiles of the 3 wt. % MWCNT/PCM nanocomposite at an IR power density of 23.6 mW/mm$^2$, size: 0.5×0.5 mm$^2$.

As shown in FIG. 26A, the dimension of the 3 wt. % MWCNT/PCM nanocomposite films used for the measurement also had a major influence on the on/off electrical conductivity ratios. At the same IR power density, the on/off electrical conductivity ratios of the nanocomposite films with a size of 0.5×0.5 mm$^2$ were consistently much higher than those of the films with a size of 1.0×1.0 mm$^2$. For instance, at an IR power density of 23.6 mW/mm$^2$, the magnitude of change in the electrical conductivity for the nanocomposite films with a size of 0.5×0.5 mm$^2$ and 1.0×1.0 mm$^2$ was 570.0 and 74.0 times, respectively, at the same IR illumination time (~12 sec). With a much longer IR illumination time (~30 sec), the magnitude of change in the electrical conductivity for the nanocomposite film with a size of 1.0×1.0 mm$^2$ sample reached 84 times, which was still much smaller than that of the 0.5×0.5 mm$^2$ nanocomposite film. This was likely due to the fact that at the same IR power density, the PEG melting and recrystallization phase transition process may have been activated more easily in the nanocomposite film with the smaller dimensions/mass. As shown in FIG. 26D, the final temperature of the 1.0×1.0 mm$^2$ sample (~82.0° C.) was slightly higher than that of the 0.5×0.5 mm$^2$ sample (~72.0° C.). This was attributed to the fact that the smaller sample had a higher surface-to-volume ratio allowing for more efficient thermal exchange between the sample itself and the surrounding environment. DSC measurements for samples with different dimensions/masses (i.e., 5.02 mg and 20.77 mg) at different heating/cooling rates (i.e., 5 and 20° C./min) showed that at the same heating and cooling rate, the peak PEG melting temperature was higher, while the peak PEG recrystallization temperature was lower for the larger sample in comparison with the smaller sample. Furthermore, this temperature difference increased at a higher heating/cooling rate.

Table 5 lists the percentage of the phase transition at two temperatures, namely, 72.0° C. and 82.0° C., calculated based on the ratio of the phase transition enthalpy (i.e., $\Delta H_T/\Delta H_{total}$). It is clear that the larger sample size and higher heating rate led to a lower degree of phase transitions. This finding may help explain why the nanocomposite film with a size of 0.5×0.5 mm$^2$ exhibited a much larger IR response than that with a size of 1.0×1.0 mm$^2$ considering the fact that the heating rates for these experiments were extremely high (i.e., around 250° C./min).

TABLE 5

Phase-change behaviors of 3 wt. % MWCNT/PCM nanocomposites.

| Sample | $\Delta H_T/\Delta H_{total}$ (%) (5° C./min) | | $\Delta H_T/\Delta H_{total}$ (%) (20° C./min) | |
|---|---|---|---|---|
| | 72° C. | 82° C. | 72° C. | 82° C. |
| 5.02 mg | 100 | 100 | 72.5 | 100 |
| 20.77 mg | 100 | 100 | 18.2 | 65.2 |

In order to explore the IR photoresponse sensitivity, the rise time (with IR on) and the drop time (with IR off) of the MWCNT/PCM nanocomposites to obtain a 63.2% change in the magnitude of the electrical conductivity regulated by on/off IR illumination was studied and is shown in FIGS. 26B-26D. As the IR power density increased, the rise time of the 0.5×0.5 mm$^2$ nanocomposite film increased from about 0.36 sec (under 2.2 mW/mm$^2$ with a total conductivity change of 1.8 times) to about 1.08 sec (under 23.6 mW/mm$^2$ with a total conductivity change of 570.0 times). When the sample size increased from 0.5×0.5 mm$^2$ to 1.0×1.0 mm$^2$, the rise time also increased from 1.08 to 6.19 sec. Hence, nanocomposite films with smaller dimensions were more sensitive and responded faster to IR illumination than those with larger dimensions.

Additionally, according to thermogravimetric analysis (TGA), the MWCNT/PCM nanocomposites exhibited good thermal stability. The temperature of the most significant weight loss for the 3 wt. % MWCNT/PCM nanocomposite occurred between 376.0 and 427.0° C. The MWCNT/PCM nanocomposite films also exhibited robust flexibility and could easily be stretched and bent. The tensile testing results for the 3 wt. % MWCNT/PCM nanocomposites are shown in Table 6.

TABLE 6

Mechanical properties of the 3 wt. % MWCNT/PCM nanocomposite.

| Samples | Tensile strength-at-break (MPa) | Tensile strain-at-break (mm/mm) | Young's modulus (E-modulus) (MPa) |
|---|---|---|---|
| 3 wt. % MWCNT/PCM | 17.3 ± 1.2 | 2.2 ± 0.3 | 310.3 ± 3.7 |

These data demonstrated that the 3 wt. % MWCNT/PCM nanocomposite films had excellent mechanical properties, thereby making them desirable for flexible optical-electrical applications.

CONCLUSIONS

IR responsive MWCNT/PCM nanocomposite films exhibiting reversible, cyclic, dramatic, and rapid electrical conductivity changes were fabricated and fully characterized. The reversible, cyclic and dramatic changes observed with IR-regulated on/off electrical conductivity ratios (up to 570.0 times) were largely attributed to the reversible IR-regulated localized PEG melting and recrystallization processes experienced by the form-stable PCM matrix, due to MWCNT's excellent photoabsorption and thermal conversion capabilities, which subsequently affected the thickness of the interfacial PCM between adjacent conductive MWCNTs and, thus, the electron tunneling efficiency between the MWCNTs. It was also found that the magnitude of the changes in the electrical conductivity ratios as well as the response time (or sensitivity) of these nanocomposite films regulated by IR irradiation depended on a number of factors including the MWCNT loading content in the nanocomposite films, the IR power density, and the sample size of the nanocomposite films measured. Finally, the MWCNT/PCM nanocomposite films also possessed desirable mechanical and thermal properties, thereby making these unique nanocomposites a material family for high-performance flexible optoelectronic applications including IR sensing, thermal imaging, and optical communication.

Methods

Materials:

Multi-walled carbon nanotubes (MWCNTs) (inner diameter: 4 nm, length: >1 μm, number of walls: 3-15, bulk density: 140-230 kg/m$^3$, purity: >99%) were purchased from Bayer Materials Science AG, 51368 Leverkusen, Germany. Triphenylmethanetriisocyanate (TTI, Boc Sciences, NY, USA) and dibutyltin dilaurate (DBT, Alfa Aesar, Mass., USA) were used as received. p-Anisidine, sodium dodecyl sulfonate and toluene were purchased from Fisher Scientific (Bellefonte, Pa.). Polyethylene glycol (PEG 6 kDa) and N,N-dimethylformamide (DMF) were of analytical grade and purchased from Sigma-Aldrich (St. Louis, Mo.). PEG 6 kDa was dried at 80.0° C. under a high vacuum (0.012 MPa) for 48 h before use. Toluene was dried for 48 h using a 5 Å molecular sieve and then distilled prior to use. All other reagents were of analytical grade.

Synthesis of Surface-Functionalized MWCNTs:

MWCNTs were functionalized with 4-methoxyphenyl diazonium according to a method described in the literature. (See, Park, J.; Yan, M., Covalent Functionalization of Graphene with Reactive Intermediates. *Acc. Chem. Res.* 2012, 46, 181-189.) Scheme 1 (FIG. 5; Step 1) shows the synthesis process used to surface-functionalize the MWCNTs. First, 4-methoxyphenyl diazonium was synthesized by dissolving 5 mmol p-anisidine in 15 mL DI water, followed by adding 1.25 mL of concentrated hydrochloric acid and 5 mmol sodium nitrite under constant stirring for 30 min. Then, 100 mg of MWCNTs and 10 mg of sodium dodecyl sulfonate (used as a surfactant) were dispersed in 100 mL of deionized water. Thereafter, the freshly made 4-methoxyphenyl diazonium solution was added to the MWCNT solution dropwise under sonication. The mixture was ultrasonicated at 300 W for 4 h at 55.0° C., and then stirred overnight at ambient temperature. It was then filtered and washed successively with water and ethanol. The resulting product—i.e., the functionalized MWCNTs—were dried overnight in a freeze-drier.

Synthesis of the Form-Stable Phase Change Material (PCM):

Scheme 1 (FIG. 5; Step 2) shows the synthesis route of the PCM. The synthesis reaction was conducted in flame-dried glassware under an inert nitrogen ($N_2$) atmosphere. Then, 3.0 g of dried PEG 6 kDa, 122.5 mg TTI, and 1.5 mg dibutyltin dilaurate (DBT) were mixed in freshly distilled toluene and stirred for 6 h in an $N_2$ atmosphere at 80.0 to 85.0° C. to obtain form-stable PCM.

Synthesis of the MWCNT/PCM Nanocomposites:

A specific amount of functionalized MWCNTs was dispersed in DMF via ultrasonication (Hielscher UP 400S, Bernau bei Berlin, Germany, 300 W, 30 min). The resulting MWCNT solution and the PCM toluene solution described earlier were mixed thoroughly using a Hielscher UP 400S probe ultrasonic sonicator. The mixture was ultrasonicated at 300 W for 30 min at 60.0° C. to obtain a well-dispersed suspension. Subsequently, the functionalized MWCNT/PCM solution was heated on a hot plate at 80.0~85.0° C. To control the rate of solvent evaporation, and thus facilitate the formation of the MWCNT/PCM nanocomposite films with uniformly distributed MWCNTs, the top of the petri dish containing the MWCNT/PCM solution was covered by Grade 2 filter paper (thickness: 0.26 mm, pore diameter: 8 μm). The resulting MWCNT/PCM nanocomposite film was further dried for 24 h at 80.0° C. under vacuum (0.0010 mBar).

Characterization:

The chemical structures of the MWCNTs, PCM, and MWCNT/PCM nanocomposites were analyzed using a Fourier transform infrared (FTIR) spectrophotometer (Bruker Tensor 27 FT-IR) at room temperature. The electrical conductivities of the nanocomposite films with a thickness of 0.15 mm and varying surface areas (e.g., 0.5×0.5 $mm^2$ or 1.0×1.0 $mm^2$) was measured using an HP4155 semiconductor analyzer (voltage bias: 5 V). The nanocomposite film was set on a Teflon plate and its two ends were covered with silver paste serving as electrical contacts. The light source was an LED with an emission peak of 813 nm. The film temperature was measured using a K-type thermocouple. A silver wire detector was placed beneath the film in order to measure the temperature accurately. Scanning electron microscopy (LEO GEMINI 1530 SEM, Zeiss, Germany) and transmission emission microscopy (TEM, FEI Tecnai T30) were used to characterize the microstructure of the graphene/PCM nanocomposites. For TEM analysis, the sample (about 70 nm in thickness) was prepared using a microtome (Reichert UltraCut E, NY USA). Differential scanning calorimetry (DSC) analyses were performed in an $N_2$ atmosphere using a Q20 DSC thermal analyzer (TA Instruments, DE USA) from 0 to 100.0° C. at a heating rate of 5° C./min and a $N_2$ flow rate of 20 mL/min. To study the effects of temperature on the structure and morphology of the PEG, PCM, and MWCNT/PCM nanocomposite films, digital images of these films were taken periodically while they were heated on a hot stage from 25.0 to 100.0° C. (5° C./min). The thermal stability of these films were characterized via thermogravimetric analysis (TGA) using a TGA/Q50 thermal analyzer (TA Instruments, DE USA). Approximately 10 mg of the nanocomposite films were heated from 30.0 to 700.0° C. at a heating rate of 10° C./min in an $N_2$ atmosphere. X-ray diffraction (XRD, Bruker D8-Discovery) analyses were carried out on the samples from 5° to 80° (diffraction angles, 2θ). UV-vis absorbance was measured using a Varian Cary 5000 Bio UV-visible spectrophotometer. Polarized optical images of the crystalline PCM were taken using a polarized light microscope (EN60950, Diagnostic Instruments Inc., MI, USA). The Raman spectra of the MWCNT/PCM nanocomposite were measured using a LabRAM Aramis micro-spectrometer.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A photodetector comprising:
   a composite comprising:
      a form-stable phase change material comprising crystalline domains of crosslinked polyether polyol surrounded by an amorphous matrix of crosslinked polyether polyol, the form-stable phase change material characterized in that it undergoes a reversible form-stable phase change upon heating;
      electrically conductive particles dispersed in the amorphous matrix of crosslinked polyether polyol; and
      radiation-absorbing particles dispersed in the amorphous matrix of crosslinked polyether polyol and characterized in that they are capable of absorbing radiation and converting it into thermal energy; and
   a probe configured to measure a phase change-induced change in the electrical resistivity of the composite.

2. The photodetector of claim 1, wherein the polyether polyol is a polyethylene glycol.

3. The photodetector of claim 1, wherein the electrically conductive particles and the radiation-absorbing particles are the same particles.

4. The photodetector of claim 2, wherein the polyethylene glycol is crosslinked by branched, urethane group-containing linkages.

5. The photodetector of claim 4, wherein the urethane groups are part of an aryl group.

6. The photodetector of claim 5, wherein the crosslinked polyethylene glycol has the structure:

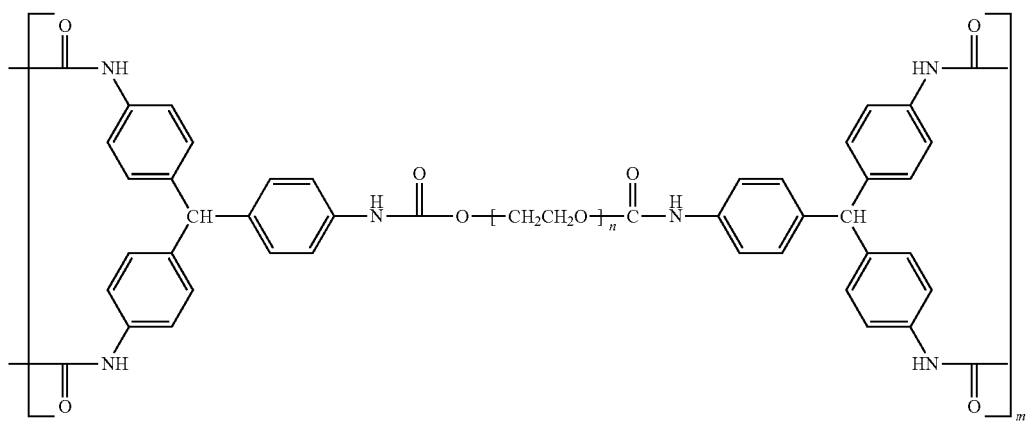

where m represents the number of repeat units in the crosslinked polyethylene glycol.

7. The photodetector of claim 3, wherein the electrically conductive particles comprise carbon particles.

8. The photodetector of claim 7, wherein the carbon particles comprise carbon nanotubes, graphene, or a combination thereof.

9. The photodetector of claim 3, wherein the electrically conductive particles are metal particles.

10. The photodetector of claim 4, wherein the electrically conductive particles comprise carbon particles.

11. The photodetector of claim 10, wherein the electrically conductive particles comprise carbon nanotubes, graphene, or a combination thereof.

12. A method of detecting radiation, the method comprising:
exposing a composite to radiation, the composite comprising:
a form-stable phase change material comprising crystalline domains of crosslinked polyether polyol surrounded by an amorphous matrix of crosslinked polyether polyol;
electrically conductive particles dispersed in the amorphous matrix of crosslinked polyether polyol; and
radiation-absorbing particles dispersed in the amorphous matrix of crosslinked polyether polyol,
wherein the radiation-absorbing particles absorb the radiation and convert it into thermal energy, thereby heating the form-stable phase change material and inducing it to undergo a reversible phase change from a first solid phase to a second solid phase, and further wherein the phase change changes the electrical resistivity of the composite; and
measuring the phase change-induced change in the electrical resistivity of the composite.

13. The method of claim 12, wherein the polyether polyol is a polyethylene glycol.

14. The method of claim 12, wherein the electrically conductive particles and the radiation absorbing particles are the same particles.

15. The method of claim 13, wherein the polyethylene glycol is crosslinked by branched, urethane group-containing linkages.

16. The method of claim 15, wherein the urethane groups are part of an aryl group.

17. The method of claim 13, wherein the crosslinked polyethylene glycol has the structure:

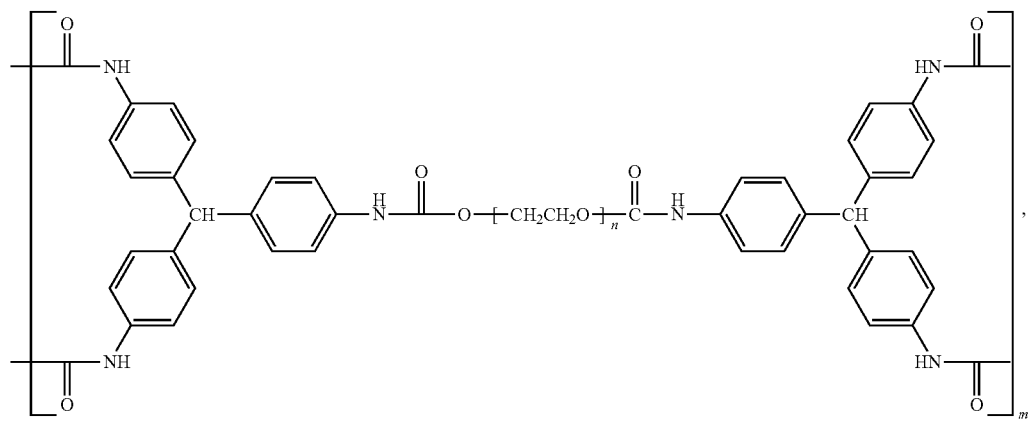

where m represents the number of repeat units in the crosslinked polyethylene glycol.

18. The method of claim 13, wherein the electrically conductive particles comprise carbon particles, metal particles, or a combination thereof.

19. The method of claim 13, wherein the electrically conductive particles comprise carbon nanotubes, graphene, or a combination thereof.

20. The method of claim 12, wherein the radiation comprises infrared radiation and the electrical resistivity of the composite in the first solid phase is at least 1000 times larger than the electrical resistivity of the composite in the second solid phase.

21. A composite comprising:
a form-stable phase change material comprising crystalline domains of crosslinked polyether polyol surrounded by an amorphous matrix of crosslinked polyether polyol, wherein the polyethylene glycol is crosslinked with triphenymethane triisocyanate and has the structure:

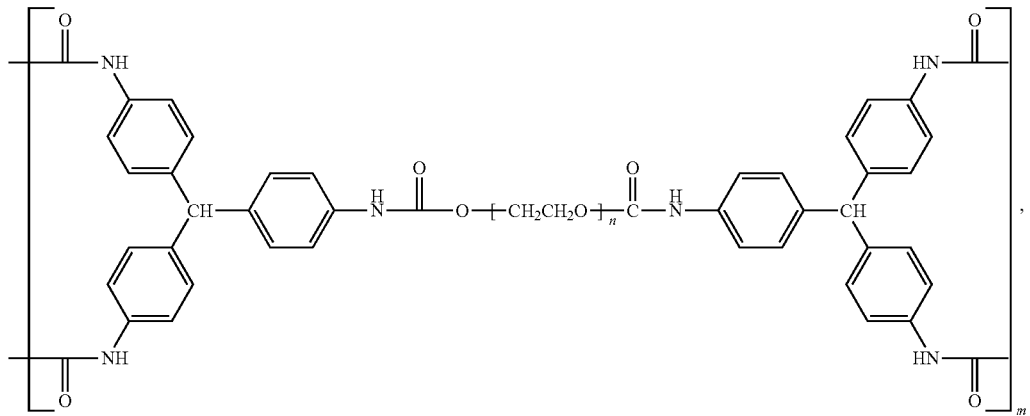

where m represents the number of repeat units in the crosslinked polyethylene glycol;
electrically conductive particles dispersed in the amorphous matrix of crosslinked polyether polyol; and
radiation-absorbing particles dispersed in the amorphous matrix of crosslinked polyether polyol and characterized in that they are capable of absorbing radiation and converting it into thermal energy.

* * * * *